United States Patent
Shinozuka et al.

(10) Patent No.: US 6,315,858 B1
(45) Date of Patent: Nov. 13, 2001

(54) GAS POLISHING APPARATUS AND METHOD

(75) Inventors: Shyuhei Shinozuka, Atsugi; Kaori Miyoshi, Fujisawa; Akira Fukunaga, Chigasaki; Yoichi Kobayashi, Atsugi, all of (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/271,864

(22) Filed: Mar. 18, 1999

(30) Foreign Application Priority Data

Mar. 18, 1998 (JP) .................................................. 10-089362
Mar. 18, 1998 (JP) .................................................. 10-089518

(51) Int. Cl.$^7$ ..................................................... C23F 1/02
(52) U.S. Cl. ........................... 156/345; 438/691; 118/300
(58) Field of Search ................................ 134/30, 32–34, 134/37, 95.3, 99.1, 103.2, 144, 153; 156/345; 216/58; 438/690–692, 706; 451/101, 446; 118/300

(56) References Cited

U.S. PATENT DOCUMENTS

| | | | |
|---|---|---|---|
| 3,622,076 | * 11/1971 | Streeter | 239/265.43 |
| 4,251,201 | * 2/1981 | Krysiak | 425/132 |
| 5,914,052 | * 6/1999 | Derderian et al. | 216/83 |
| 5,964,952 | * 10/1999 | Kunze-Concewitz | 134/2 |
| 5,980,979 | * 11/1999 | Rohner | 427/97 |

FOREIGN PATENT DOCUMENTS

6218673  * 8/1994  (JP) .
10060673  * 3/1998  (JP) .
10-242129  9/1998  (JP) .

OTHER PUBLICATIONS

New U.S. application filed Mar. 18, 1999, entitled "Method, Apparatus and Nozzle Device for Gaseous Polishing", by Shyuhei Shinozuka et al., Attorney Docket No. 1213/GEB821US.

New U.S. application filed Mar. 18, 1999, entitled "Gas Polishing Method and Apparatus", by Kaori Miyoshi et al., Attorney Docket No. 1213/GEB823US.

P.B. Mumola et al., Hughes Danbury Optical Systems, Inc., Semiconductor World 1994.4, pp66–67, Apr. 1994.

* cited by examiner

*Primary Examiner*—Felisa Hiteshew
*Assistant Examiner*—Duy-Vu Deo
(74) *Attorney, Agent, or Firm*—Wenderoth, Lind & Ponack, L.L.P.

(57) ABSTRACT

A polishing apparatus can replace or be used in association with a conventional chemical mechanical polishing method to produce a high quality flat surface in a more efficient manner. The polishing apparatus utilizes a nozzle device, disposed to face a work surface of a workpiece, for performing gas polishing by ejecting a reactive polishing gas to the work surface. The nozzle device comprises a nozzle assembly having nozzles that has a plurality of differing diameters. A nozzle selection device is provided for selecting an operative nozzle having a desired diameter from the nozzle assembly and ejecting the polishing gas through a selected nozzle.

21 Claims, 25 Drawing Sheets

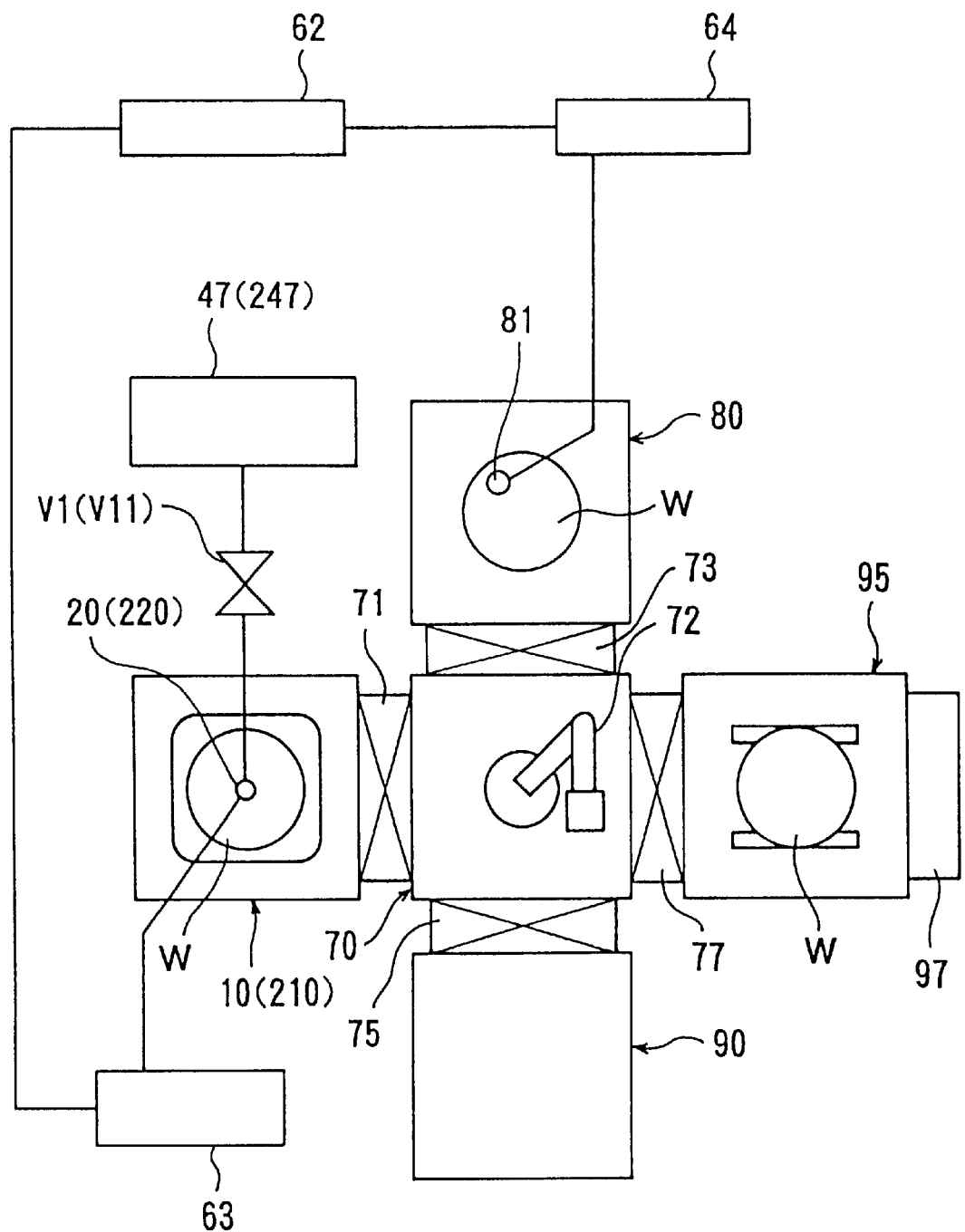
F I G. 1

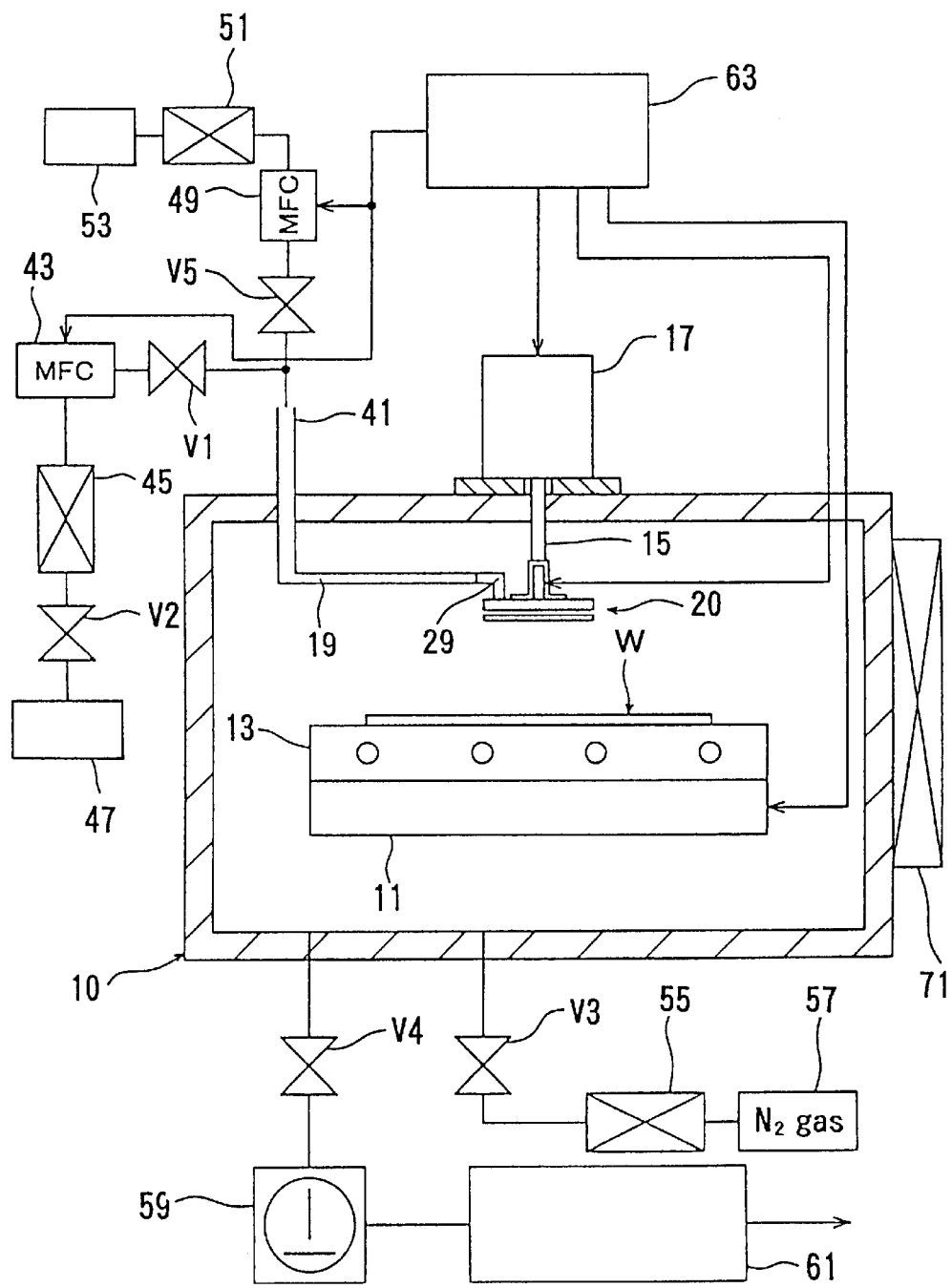
F I G. 2

F I G. 9
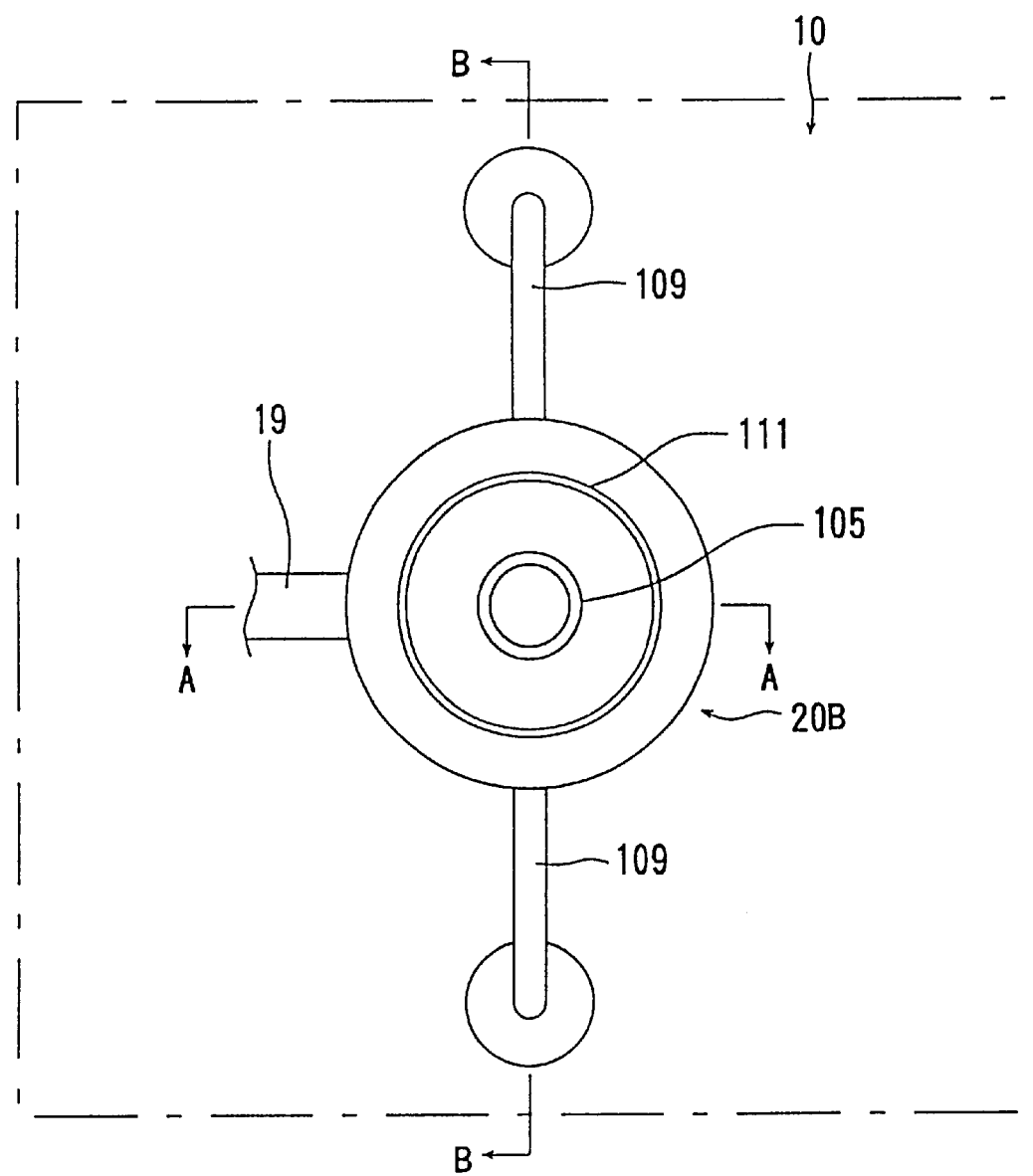

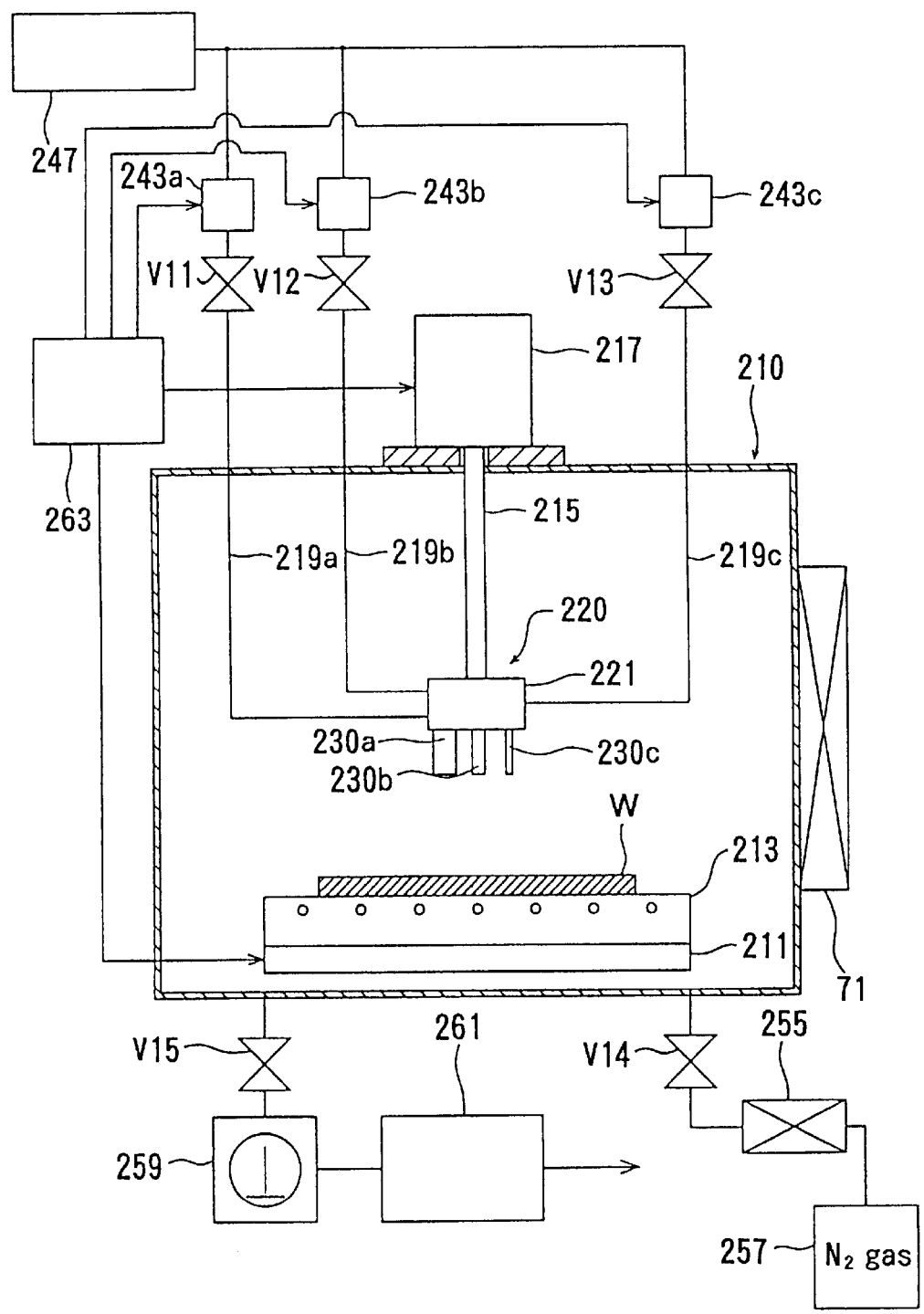
F I G. 1 1

F I G. 12A
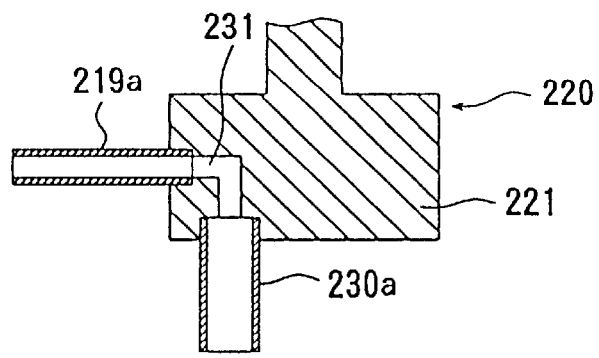
F I G. 12B
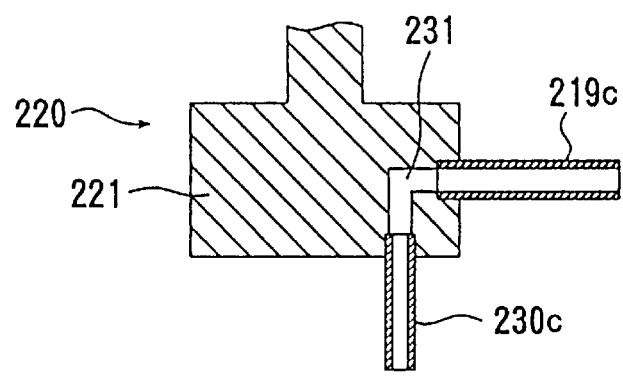
F I G. 12C
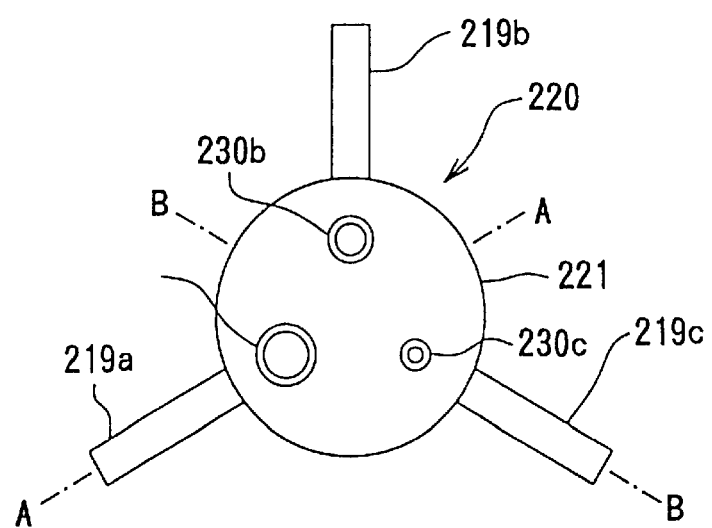

F I G. 17
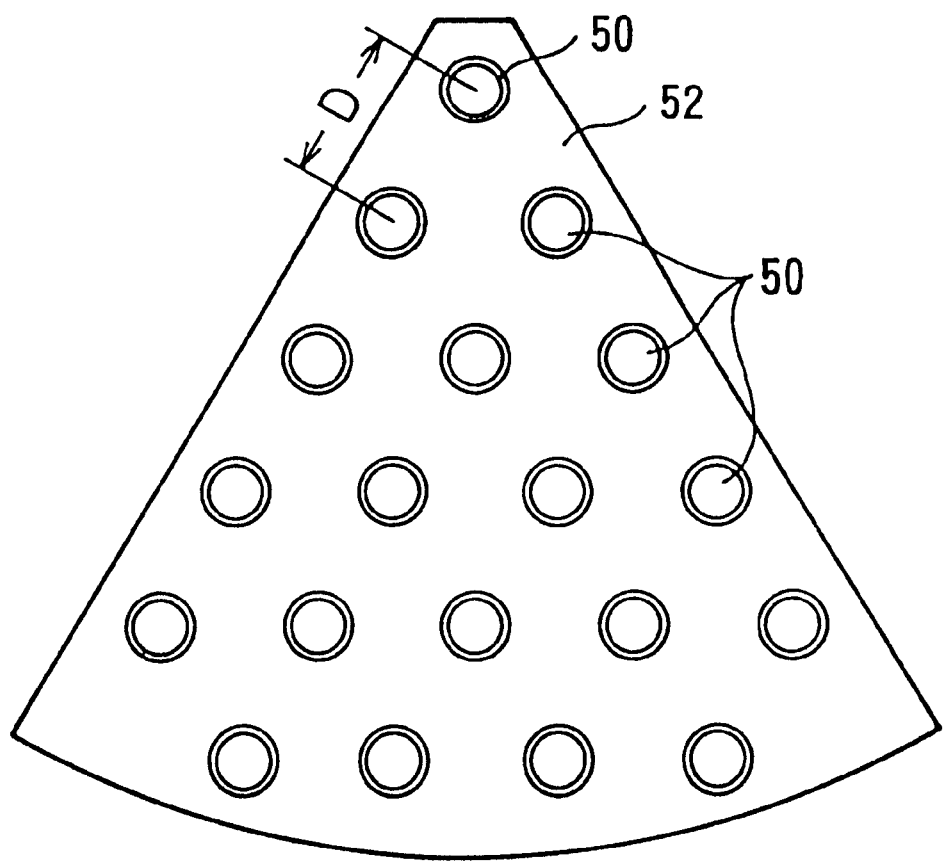

D = 4   δ = 0.25

D = 16   δ = 1.0

D = 8   δ = 0.5

D = 20   δ = 1.25

D = 12   δ = 0.75

D = 24   δ = 1.5

F I G. 2 1
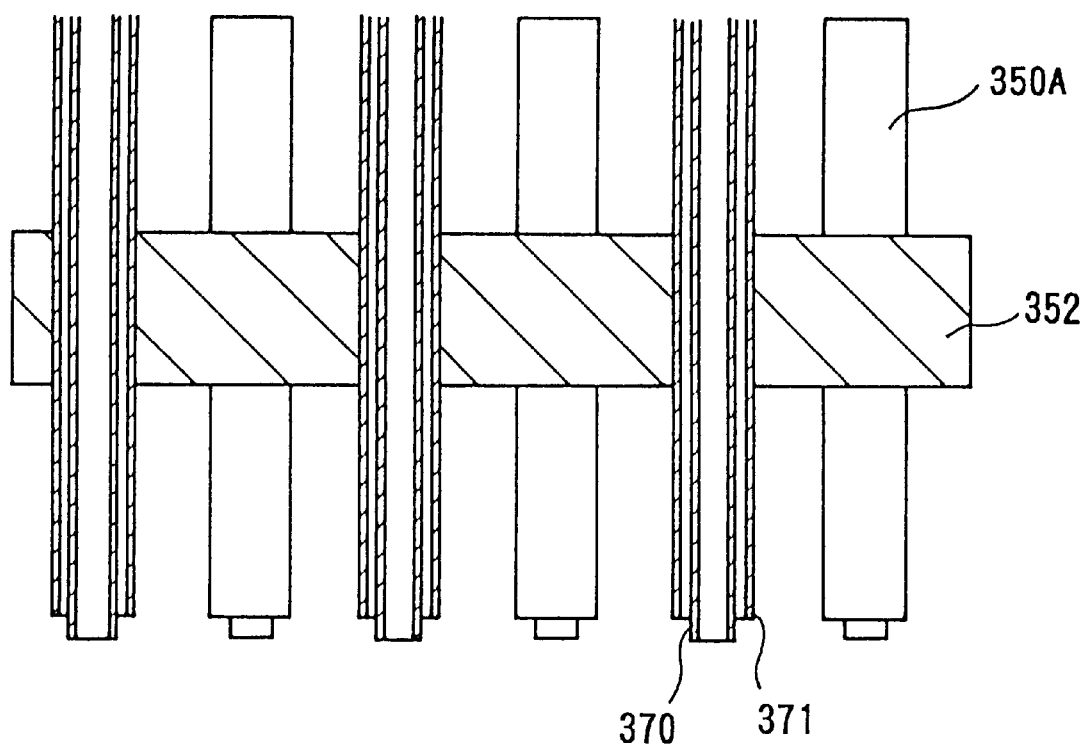

GAS POLISHING APPARATUS AND METHOD

BACKGROUND OF THE INVENTION

1. Field of the Invention

The present invention relates to a gas polishing apparatus having a gas nozzle device to produce a flat surface by removing surface structures on a workpiece such as semiconductor wafer using a reactive gas, or conversely, to fabricate a given surface structure on the work surface.

2. Description of the Related Art

As the density of circuit integration in semiconductor devices becomes ever higher, circuit patterns are becoming finer and interline spacing narrower. Accompanying this trend, the depth of focus become very shallow in photolithographic reproduction of circuit patterns, and it requires that the surface of the wafer placed at the focal plane of a stepper must be microscopically flat to produce the required degree of image sharpness.

A method of producing such a flat surface on a wafer is known as a chemical mechanical polishing (CMP) in which a work surface of a wafer which is held in a wafer holding device is pressed and rotated against an abrading surface of a polishing table while supplying a polishing solution at the abrading interface.

However, the CMP process is designed to produce flatness by polishing the entire surface of a wafer as a whole, and therefore, it is not suitable for removing macroscopic surface irregularities, such as those shown in FIG. 25, and results in removal of much quantity of material and is thus time-consuming.

SUMMARY OF THE INVENTION

It is an object of the present invention to provide a polishing apparatus and a polishing method to replace or to be used in association with a conventional chemical mechanical polishing method to produce a high quality flat surface in a more efficient manner.

The first aspect of the present invention is a nozzle device, disposed to face a work surface of a workpiece, for performing gas polishing by ejecting a reactive polishing gas to the work surface comprising: a nozzle assembly comprising nozzles having a plurality of differing diameters; and a nozzle selection device for selecting an operative nozzle having a desired diameter from the nozzle assembly and ejecting the polishing gas through a selected nozzle.

Thus, a proper nozzle diameter can be selected to form a proper diameter of gas flow suitable for providing a proper gas polishing condition required for respective workpieces.

The nozzle assembly may include a nozzle plate provided with the nozzles having a plurality of differing diameters, and a valving device disposed rotatably relative to the nozzle plate for selectively operating one nozzle for ejecting the polishing gas.

Another aspect of the present invention is a nozzle device, disposed to face a work surface of a workpiece, for performing gas polishing by ejecting a reactive polishing gas from a nozzle to the work surface, wherein the nozzle includes a nozzle diameter varying device for varying a diameter of a nozzle opening for ejecting the polishing gas.

Still another aspect of the present invention is a nozzle device for ejecting a reactive polishing gas towards a work surface of a workpiece, comprising: a nozzle assembly including a plurality of nozzles arranged at a specific spacing; and a flow control device to adjust individual gas flow through each of the nozzles.

When the workpiece is placed in a reduced pressure polishing chamber, such a nozzle device enables adjustment of the pressure, flow speed, flow volume, and polishing duration individually for each of the plurality of nozzles to correspond to the degree of polishing required in each location on the work surface. This approach permits a given area of the work surface to be processed at one time.

The amount of material to be removed can be predetermined by measuring the fine surface structures of the workpiece and computing the respective amounts. A remote sensor may be provided at the tip of each nozzle to measure the surface structure and the polishing requirements can be determined in real-time to adjust the flow conditions while performing the gas polishing process described above.

It is preferable to increase the profile shaping capability of the nozzle device by performing polishing of local areas on the work surface, therefore, the nozzle shape and diameter should be chosen to suit the local polishing requirements. For example, in order to avoid affecting areas other than a targeted area, an exhaust opening may be provided near the gas exit. Also, for a similar purpose, nozzles may be operated intermittently to produce pulsed ejection to improve the control over the amount of gas ejected in a pulsed mode.

The nozzles may be distributed over an area corresponding to the entire surface of the work surface. In such a case, the entire surface of the work surface can be polished in one operation. The nozzles may also be distributed over an area corresponding to a sector of the workpiece. Such a structure of the nozzle device will enable complete polishing of a work surface in a number of stages equaling the number of sectors.

The flow control device may have a valve for each nozzle to individually close or open the gas supply tubes which supply a polishing gas, and the valve may be provided integrally with the nozzle assembly. This design minimizes the amount of residual gas trapped in the space between the shutter disc and the nozzle end to improve control precision.

The nozzle assembly may be provided with a nozzle position adjusting device to adjust a spacing between the nozzles. Accordingly, the nozzle separation distance can be adjusted to suit the polishing parameters such as the size of the workpiece, polishing conditions and purpose of polishing to perform polishing optimized to local requirements.

In the nozzle device, the nozzles may be separated by a distance D given by a relation: $0.9d/1.177 < D \geq 1.1d/1.177$ where d is half of a width of a recess profile produced by a single nozzle. Such a design produces a flat bottom in the etched profile so that a large area of the work surface may be processed efficiently.

The nozzle spacing D may be selected such that $D < d/1.177$ where d is half of a width of a recess structure produced by a single nozzle. By using a nozzle device of such a design, the surface profile produced by a nozzle assembly is deeper than that produced by the single nozzle. Therefore when the sizes of the surface irregularities are large, $D < d/1.177$ should be used. For a nozzle spacing D' for processing even a larger area, a relation be such that $D' = d'/1.177$ ($\pm 10\%$) where d' is half of the width for a single nozzle. Under these conditions, a deeply etched area of a large diameter having a flat bottom can be produced.

The nozzles may be distributed in a plane such that each nozzle forms an apex of an equilateral triangle. By so doing, the distance between the adjacent nozzles becomes equal so that uniform polishing can be performed effectively.

The flow control device may have a valve for individually closing or opening gas supply tubes for supplying the polishing gas to each nozzle, and the valve may be provided in proximity to the nozzle assembly. This design minimizes the amount of residual gas trapped in the space between the valve and the nozzle end to improve control precision.

The polishing apparatus described above may be combined with an associated mechanical chemical polishing device. Such an apparatus enables production of a localized polishing of a work surface to polish surface structures or to prepare the work surface for their removal, and then the gas polished work surface can be subjected to a CMP process to remove residual irregularities. The combined approach will enable efficient attainment of a high degree of flatness on a workpiece.

Another embodiment of the present invention is a method for polishing a work surface of a workpiece comprising the steps of: placing a plurality of nozzles to face the work surface; and performing polishing by periodically flowing a specific amount of a reactive polishing gas in pulsed modes through nozzles while controlling a flow rate of the polishing gas by adjusting a count of pulses through each nozzle; wherein the plurality of nozzles are arranged at a spacing D according to a relation: $0.9d/1.177 < D \geq 1.1d/1.177$ where d is half of a width of a recess profile produced by a single nozzle.

BRIEF DESCRIPTION OF THE DRAWINGS

FIG. 1 is a schematic plan view of an overall arrangement of the polishing facility of the present invention;

FIG. 2 is a cross sectional view of the gas polishing chamber based on a first embodiment of the nozzle device;

FIG. 9 is a bottom view of the essential parts of the third embodiment of the variable diameter nozzle device;

FIG. 11 is a cross sectional view of the gas polishing chamber based on a fourth embodiment of the nozzle device;

FIGS. 12A, 12B, 12C are, respectively, a cross sectional view through a plane A—A in FIG. 12C, another cross sectional view through a plane B—B in FIG. 12C and a bottom view of the fourth embodiment of the nozzle device;

FIG. 17 is a cross sectional view of an assembly of gas ejection nozzles;

FIG. 21 is a cross sectional view of another example of the nozzle assembly ;

DETAILED DESCRIPTION OF THE PREFERRED EMBODIMENTS

Figure 3A:
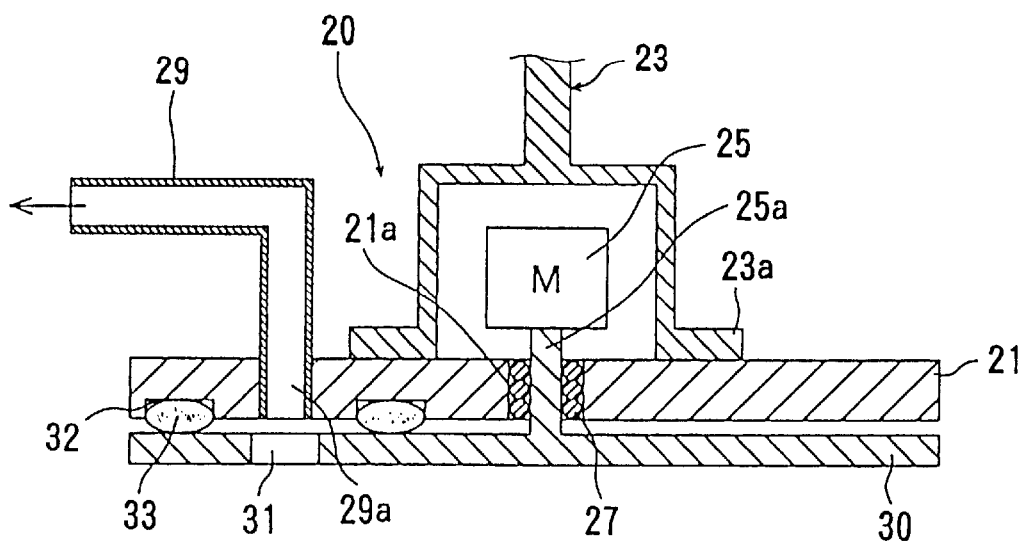
FIGS. 3A, 3B are, respectively, a cross sectional view and a bottom view of a variable diameter nozzle device.

Preferred embodiments will be presented in the following with reference to the drawings. FIG. 1 is a plan view of the overall arrangement of the polishing facility, FIG. 2 is a cross sectional view of a gas polishing chamber 10. The polishing apparatus comprises: a central robot chamber 70; gate valves 71, 73, 75 and 77 surrounding the robot chamber 70 for connecting with the polishing chamber 10, a surface measuring chamber 80, a chemical mechanical polishing (CMP) chamber 90, a wafer storage chamber 95; and a central control device 62 to control the operations of each chamber and the associated devices. The polishing chamber 10 includes a polishing location control device 63 to control the location of an area to be polished, and the surface measuring chamber 80 includes a structure measuring device 64 to determine fine surface structures according to output signals from a remote profile sensor 81, for example, for non-contact measurement of the distance to the surface of the workpiece W.

Robot chamber 70 has a manipulator 72. The CMP chamber 90 includes: a top ring for holding a wafer (workpiece) and for pressing and rotating the wafer against a turntable having a polishing tool such as a polishing cloth or abrasive stone. Wafer storage chamber 95 has a door member 97 for loading and unloading the wafer.

As shown in FIG. 2, the polishing chamber 10 includes at least an x-y table 11 for moving the workpiece W, a heater 13 provided above the table 11, and a variable diameter nozzle device 20 positioned at a given distance above the heater 13. The variable diameter nozzle device 20 is connected through a support rod 15 to an axial-drive device (z-drive) 17, and to a flexible tube 19 for supplying a reactive polishing gas.

Figure 3B:
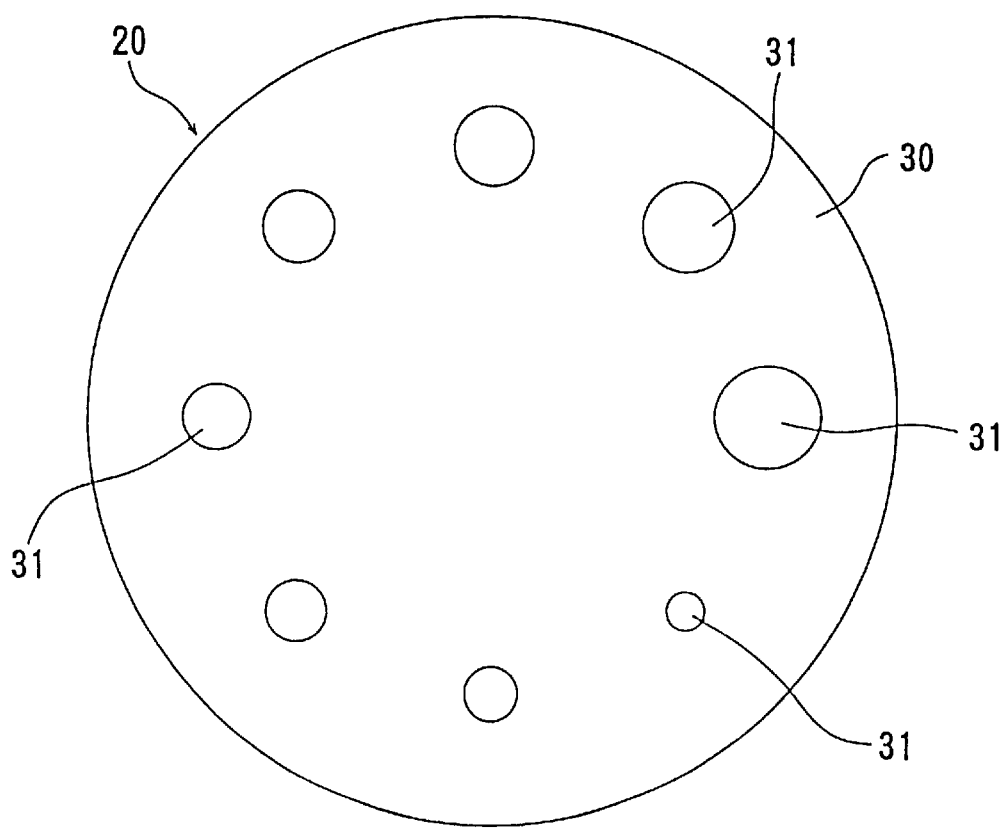

FIG. 3A shows a cross sectional view of the variable diameter nozzle device 20 and FIG. 3B shows a bottom view of the nozzle device 20. The nozzle device 20 comprises: a circular base plate 21; a cup-shaped cover member 23 fixed in a central location above the base plate 21 through a flange 23a; and a nozzle drive device (motor) 25 disposed inside the cover member 23; and a circular nozzle plate (nozzle diameter altering device) 30 below the base plate 21. The nozzle plate 30 passes through a hole 21a provided in the center of the base plate 21 and is attached to the drive shaft 25a of the drive motor 25, which rotatably supports the nozzle plate 30 through a bearing 27.

The nozzle plate 30 has a plurality of nozzles 31 of differing diameters (eight in this example) disposed equidistantly at a given radius from the center of the nozzle plate 30. The inside diameters of the nozzles range, in this case, from the smallest nozzle at several micrometers to the largest nozzle at several tens of millimeters, and the diameters for the remaining six nozzles are suitably chosen within this range.

A supply pipe 29 for attaching the flexible tube 19 is installed near the outer periphery of the base plate 21 to correspond to a nozzle 31 so as to open at the bottom plate of the base plate 21, which serves as the nozzle opening 29a. O-ring grooves 32, respectively having an O-ring 33, are provided on the bottom surface of the base plate 21 to seal the respective nozzle opening 29a. This construction of the gas opening assures that the polishing gas supplied through the supply pipe 29 will be ejected only through a nozzle 31 positioned to face the nozzle opening 29a.

As shown in FIG. 2, the opposite end of the flexible tube 19 is connected to a pipe 41 which is connected to the polishing gas source 47 through a valve V1, a mass flow controller 43, a filter 45 and a valve V2 as well as to an inert gas source 53 through a valve V5, a mass flow controller 49 and a filter 51.

The polishing chamber 10 is connected to a nitrogen gas source 57 through a valve V3 and a filter 55, as well as to a cleaning device 61 through a valve V4, and a Roots pump 59. Operation of the mass flow controllers 43, 49, motor 25 (see FIG. 3), x-y table 11, and the z-drive 17 is controlled by a position control device 63 while other various devices are controlled by the central control device 62.

An example of overall operational steps of the gas polishing apparatus will be explained in the following.

(1) A wafer W (workpiece) is introduced into the wafer storage chamber 95 through the loading/unloading door 97 and is stored therein. The manipulator 72 is used to transfer the wafer W to the CMP chamber 90. The wafer W is polished in the CMP chamber 90 in the usual manner. Depending on the nature of the workpiece W, CMP may not be needed so that the process can start from step (2).

(2) Next, the polished wafer W is transferred to the surface measuring chamber 80 using the manipulator 72, and after evacuating the chamber 80, the entire surface of the wafer W is scanned using a remote profile sensor 81 to determine the surface structure of the entire work surface. The process of surface structure examination may be carried out under an atmospheric pressure. The data, pertaining to a polishing location and an amount of the material necessary to be removed from that location to produce a flat surface on the wafer, are memorized in the control device 62 (see FIG. 1).

(3) Next, as shown in FIG. 2, the wafer W is transferred from the surface measuring chamber 80 and is placed on top of the heater 13 (that is, on top of the x-y table 11) in the gas polishing chamber 10 using the manipulator 72.

(4) At this time, the gate valve 71 is closed and, while keeping the valves V1, V3 and V5 closed, valve V4 is opened to evacuate the polishing chamber 10 to obtain a degree of vacuum (several torr to 0.01 torr).

(5) Next, by operating the x-y table 11, the wafer W is moved directly under the nozzle opening 29a of the variable diameter nozzle device 20, shown in FIG. 3, so as to bring the target location memorized in the control device 62 to the processing position. Also, the z-drive 17 is operated to adjust the distance between the wafer W and the nozzle 31 to a pre-determined value. At this time, by operating the motor 25, the nozzle plate 30 is rotated so that a nozzle 31 of a desired diameter (among the eight nozzles) is brought directly under the nozzle opening 29a of the supply tube 29. The wafer W is heated in the meantime to a desired temperature, 50° C. for example, by the heater 13.

Figure 4:
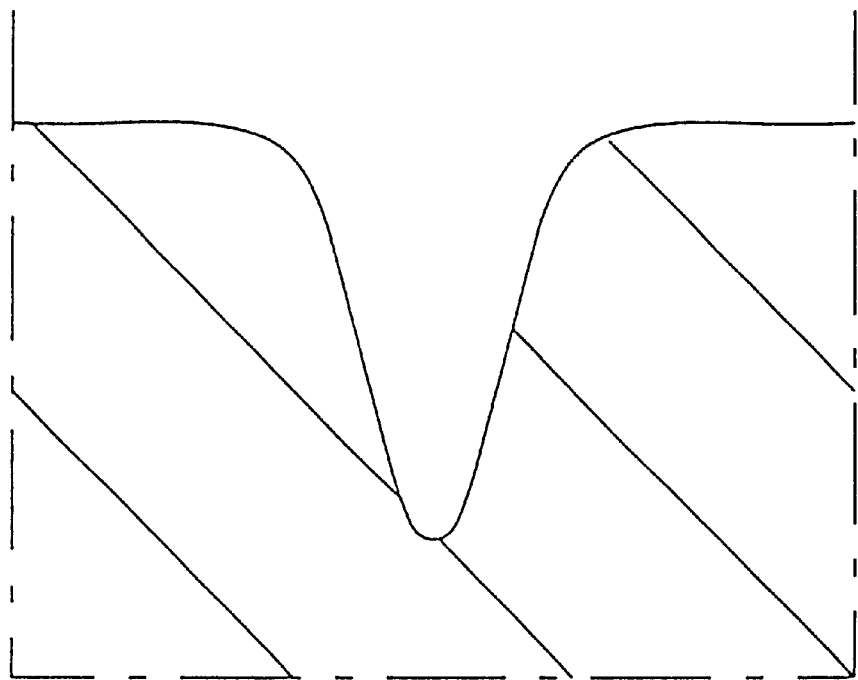
FIG. 4 is a profile of an example of a fine surface structure produced by gas polishing.

(6) Next, the polishing gas is supplied by opening the valves V1, V2 and V5 so as to produce a mixture of a desired proportion of the component gases (a mixture of $ClF_3$ and Ar, for example) according to the predetermined polishing parameters including a flow rate and a flow duration. The gas is ejected from the downstream end of the nozzle 31 at an ultrasonic speed or subsonic speed. This operation produces a fine undulated structure, such as the one shown in FIG. 4, on the work surface of the wafer W, depending on the combination of flow rate, flow duration and the diameter of the nozzle 31.

(7) After completing the gas polishing step, the steps (5, 6) are repeated so that all of the target locations memorized in the control device 62 would be processed. In this process, depending on the desired dimensions of the recess structures at various locations, the nozzle plate 30 is rotated to bring a nozzle 31 having a suitable diameter directly under the nozzle opening 29a of the supply tube 29.

(8) When all the targeted locations have been processed, valves V1, V5 are closed to stop the flow of polishing gas, and the polishing gas is thoroughly exhausted from the polishing chamber 10 using the Roots pump 59, then the valve V4 is closed and the valve V3 is opened to return the polishing chamber 10 to an atmospheric pressure.

(9) The gate valve 71 is opened and the wafer W is taken out by the manipulator 72 to return the wafer W to the surface measuring chamber 80 to re-measure the surface structure.

(10) When the planarity of the wafer W is within an allowable range, the wafer W is brought to the CMP chamber 90 to be processed again using the manipulator 72, and thereafter it is transferred to the storage chamber 95, or the wafer W is transferred directly to the storage chamber 95. From the storage chamber 95, the wafer W is forwarded to subsequent processing stations.

(11) When the planarity of the wafer W is outside the allowable range, the wafer W is returned to step (3) to repeat the gas polishing steps again. In the re-processing steps, polishing parameters to be used are those determined in step (9).

Depending on the nature of the workpiece, the wafer W may be processed directly in the gas polishing chamber 10 without being processed first in the CMP chamber 90.

As described above, the design of the variable diameter nozzle device 20 enables a plurality of nozzles of different diameters to be utilized using one nozzle mechanism, thereby eliminating the necessity for changing the nozzle to a different diameter, to meet the polishing requirements at various target locations, and facilitating the gas polishing operation.

In the above embodiment, the workpiece W was represented by a silicon wafer with a poly-Si surface film so that the film material is polished (etched). The polishing gas was a mixture of $ClF_3$ and Ar in a ratio of 1:2, which was ejected through a separation distance between the nozzle tip and the work surface of 1 mm, from a nozzle 31 of 6 mm (¼ inch) diameter and flowing a volume of 90 cubic centimeters for a 0.6 second duration, for example. This process produced a fine undulation of about 1,000 Å deep.

It should be noted that the number of nozzles 31 provided on the nozzle plate 30 and their dimensions may be altered to suit various applications so long as the necessary range of nozzle diameters can be accommodated within one nozzle plate. The material for making the variable diameter nozzle device 20, such as the nozzle plate 30, includes any corrosion-resistant material such as stainless steels and nickel-based metals and ceramic materials such as SiC, $Al_2O_3$. This concept applies to all the embodiments which follow.

Figure 5:
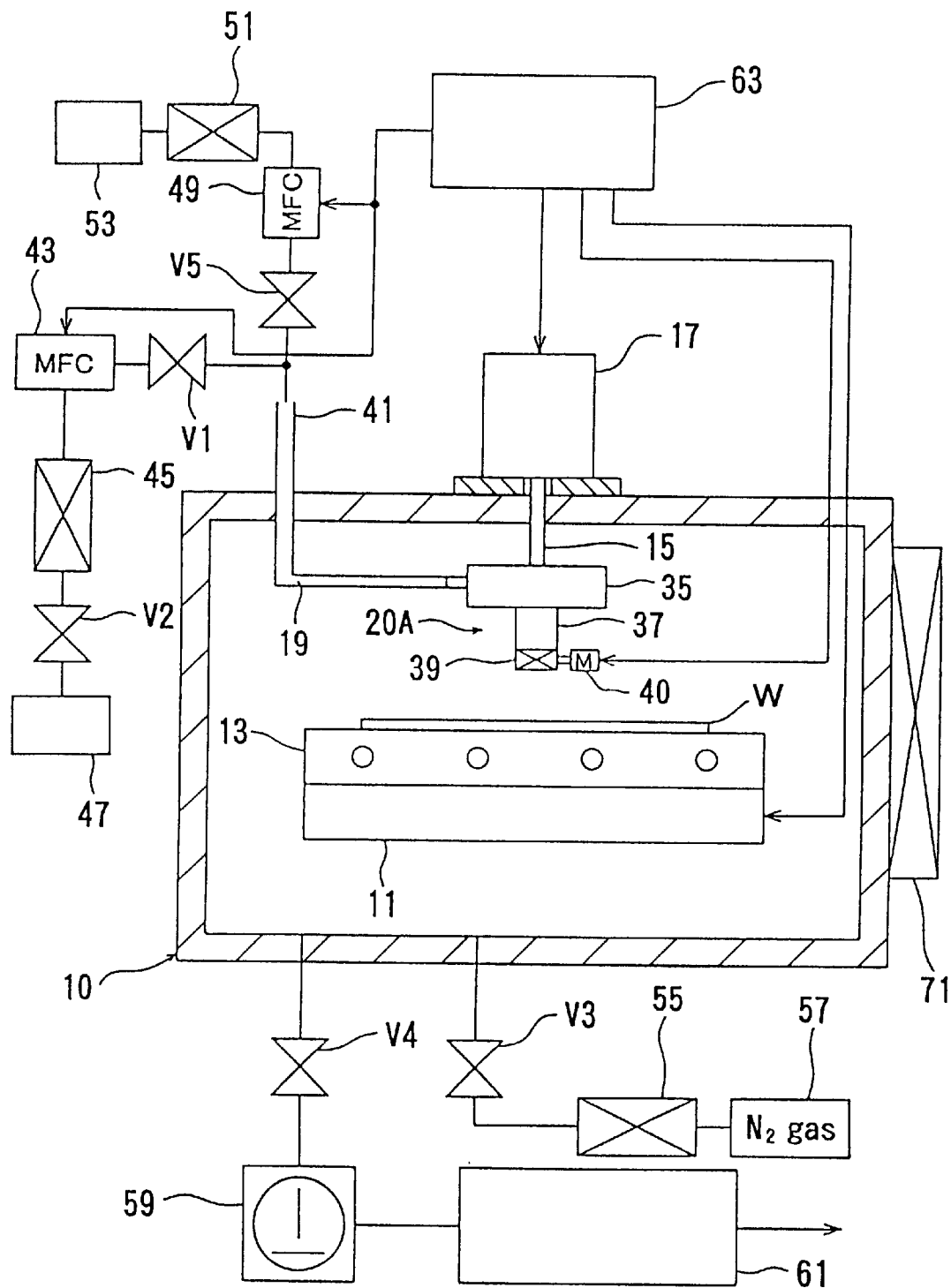
FIG. 5 is a cross sectional view of the gas polishing chamber based on a second embodiment of the nozzle device.

FIG. 5 shows cross sectional view of a polishing chamber 10 based on a second embodiment of the nozzle device of the present invention. A variable diameter nozzle device 20A used in the polishing chamber 10 shares many common parts which are given the same reference numerals as before and their explanations are omitted. The difference between the nozzle device 20 and the nozzle device 20A is in the mechanism of producing the variable diameter.

Figure 6:
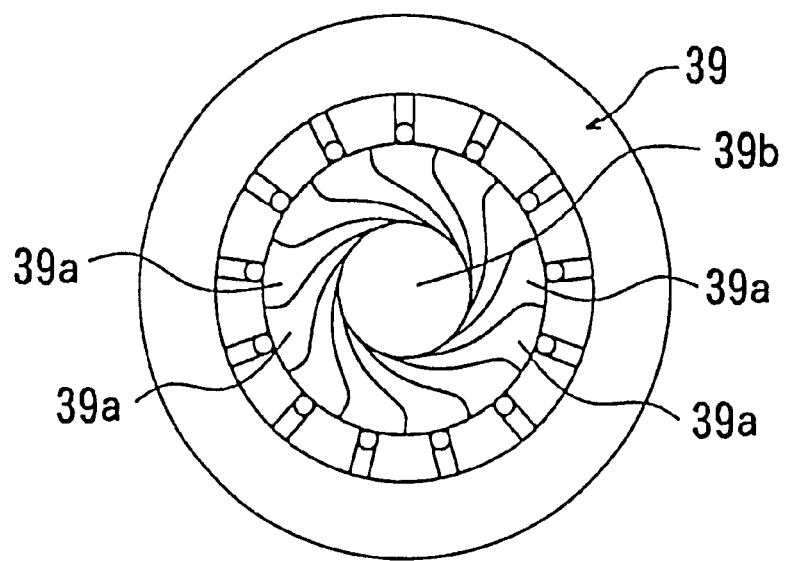
FIG. 6 is a plan view of an example of an iris device of the present invention.

In the case of the variable diameter nozzle device 20A, an iris device 39 (nozzle aperture varying device) is disposed at the downstream end of gas supply pipe 37 so as to block the nozzle opening of the pipe 37, which is connected to a gas header 35 supported on a support rod 15. The iris device 39 is operated by a motor 40 and can be made of a known iris devices used in cameras and video-recorders. FIG. 6 shows a plan view of an example of the iris device 39, in which several flat strips 39a are layered in a ring form to form a central gas opening 39b. The diameter of the gas opening 39b can be varied, for example, by driving the strips 39a simultaneously in one direction by means of a motor 40. In this embodiment, the aperture diameter can be varied from 100 mm to 10 mm.

As in the first embodiment, the iris device 39 is adjusted by operating the motor 40 so as to give a desired diameter of the gas opening 39b, and the nozzle device 20A is moved to a target location on the work surface of the wafer W. Next, valves V1, V2, V5 are opened, and the polishing gas is ejected from the gas opening 39b at an ultra-sonic (or subsonic) speed at a given flow rate and duration to produce a fine undulated structure of a desired shape and size. Next, the nozzle device 20A is moved to another target location, and the diameter of the iris device 39b is adjusted to suit the polishing requirements pre-determined at that polishing location. Other aspects of the polishing operation are the same as those in the first embodiment, and will not be described.

Figure 7:
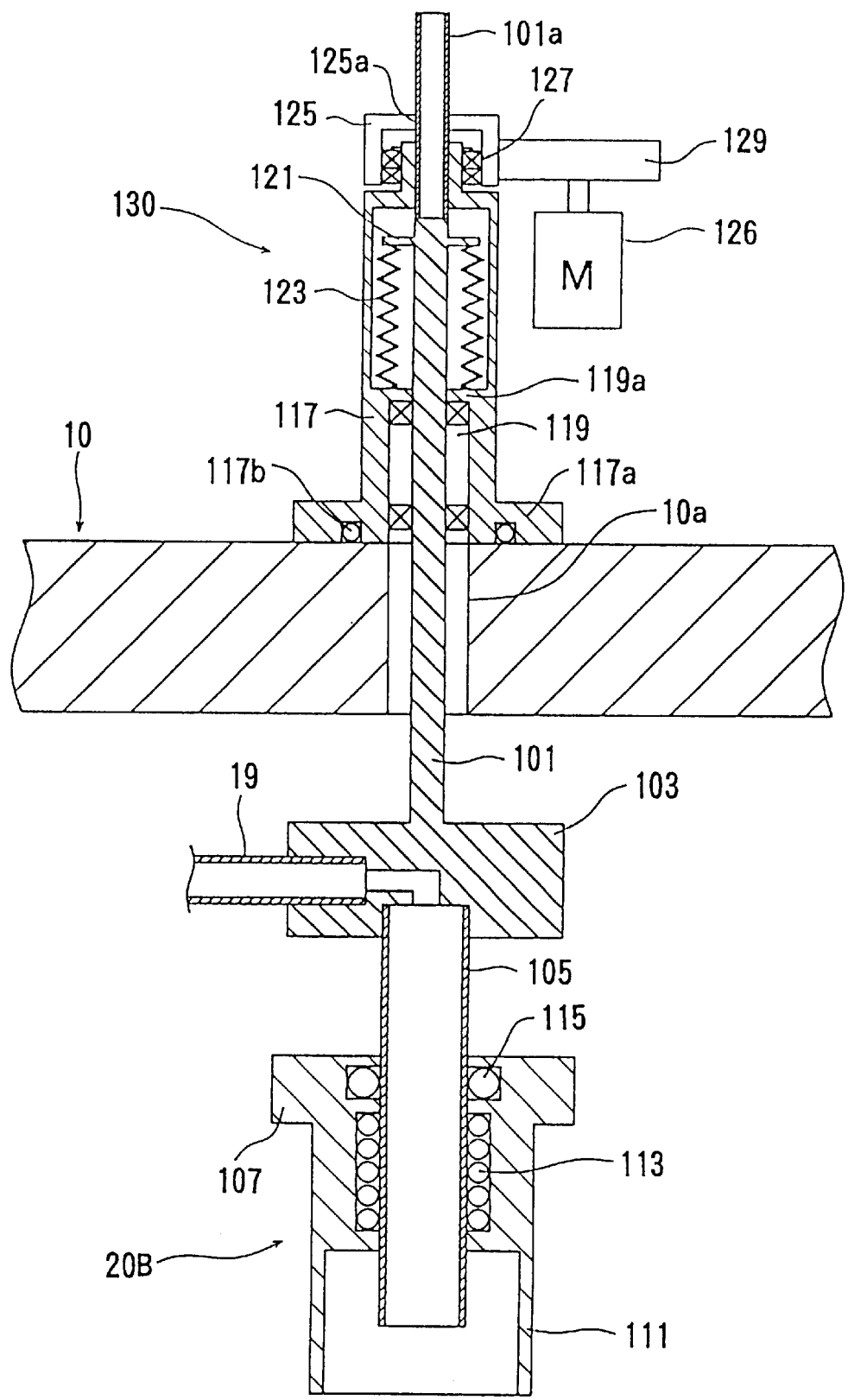
FIG. 7 is a cross sectional view of essential parts of a third embodiment of the variable diameter nozzle device.
Figure 8:
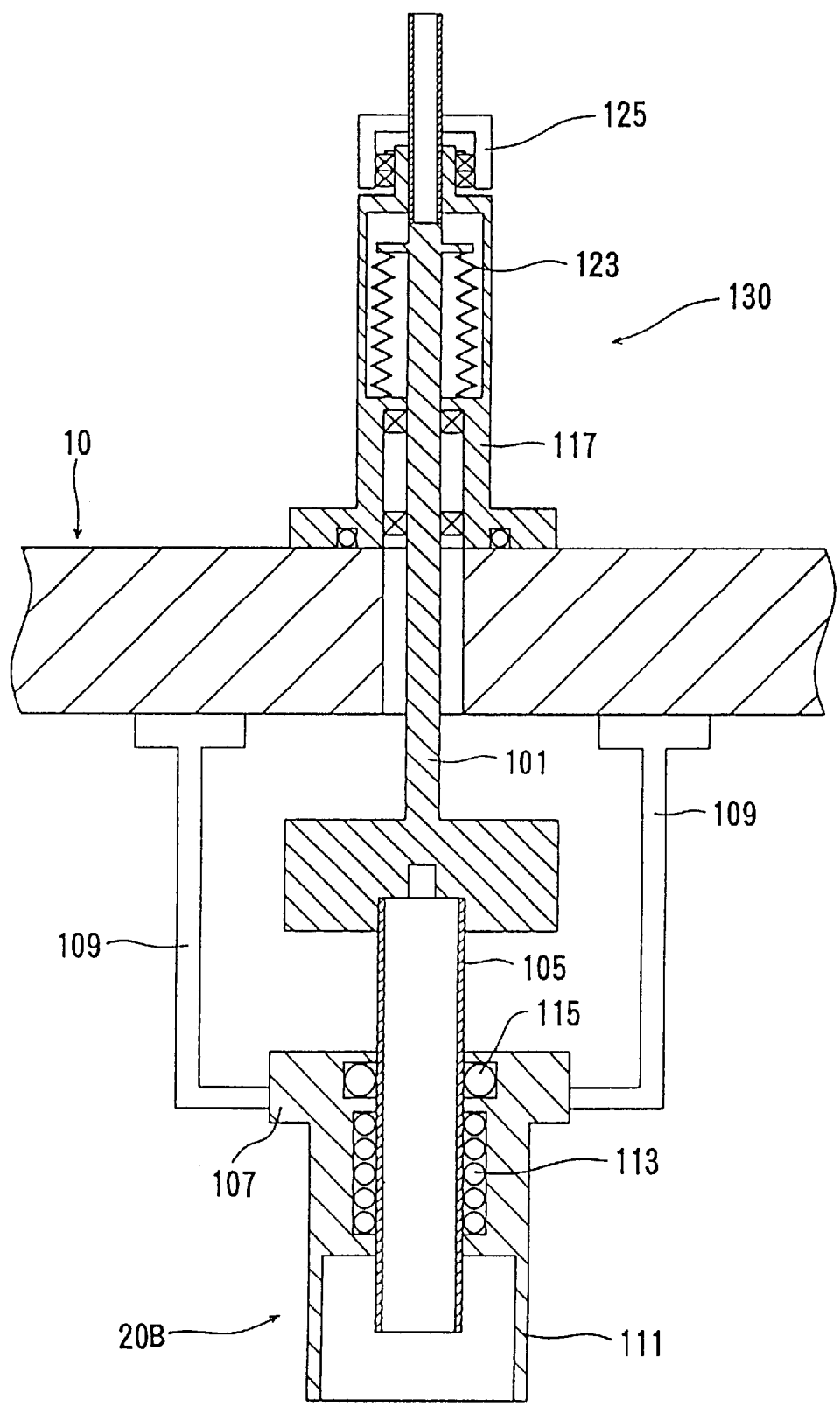
FIG. 8 is a cross sectional view of the essential parts of the third embodiment of the variable diameter nozzle device.

FIGS. 7~10 show a third embodiment of the variable diameter nozzle device. FIG. 9 shows a bottom view of this nozzle device 20B, and FIGS. 7 and 8 show cross sectional views through planes A—A and B—B, respectively, shown in FIG. 9. These nozzle devices 20B are fixed in place vertically so that it is desirable to convert the x-y table 11 into a x-y-z table. Other structural aspects of the apparatus are the same as those in the first embodiment.

The nozzle device 20B comprises: an inner nozzle 105 made of a small diameter cylinder fixed to the bottom surface of a base section 103 at the bottom of a support rod 101; and an outer nozzle body 107 attached to the outer periphery of the inner nozzle 105; and a pair of arm members 109, attached to the inside wall of the polishing chamber 10 to firmly support the outer periphery of the outer nozzle body 107.

The bottom section of the outer nozzle body 107 includes an outer nozzle 111 having an inside diameter which is a certain size larger than the outer diameter of the inner nozzle 105. The inner nozzle 105 can move vertically along the inside surface of the outer nozzle body 107 smoothly by way of a bearing 113, and an O-ring 115 confines the polishing gas.

A linear drive device 130 is used to move the support rod 101 vertically in a through-hole 119 provided in a cylinder 117 which is attached firmly to the outer top surface of the polishing chamber 10. The interior space of the polishing chamber 10 is isolated from the external atmosphere by means of a bellows section 123 which is installed between an upper flange 121 and the step end 119a of the through-hole 119. The elevator device is comprised by a male thread 101a formed on the upper portion of the support rod 101 to be coupled to a female thread 125a formed in the center of a handle 125 whose inside periphery is coupled to a shaft section 127 which supports the support rod 101 rotatably about the cylinder 117. The drive for the shaft section 127 is provided by a gear arrangement, provided on the outer surface of the handle 125, which is engaged to a drive gear 129 driven by a motor 126. The interior of the polishing chamber 10 is isolated by a feed-through arrangement, provided at the access hole 10a for the support rod 101, which is comprised by an O-ring 117b provided for sealing the cylinder 117 at a flange 117a, as well as by the bellows 123.

In this embodiment, a targeted polishing location is brought directly under the nozzle 111 with a given separation distance, and in the conditions shown in FIGS. 7 and 8, a polishing gas is supplied through the flexible tube 19. The polishing gas is ejected from the downstream end of the inner nozzle 105 at a supersonic (or sub-sonic) speed. Because the inner nozzle 105 is retracted inside the outer nozzle 111 in these conditions, the gas ejected from the inner nozzle 105 spreads out to the diameter of the outer nozzle 111 to be ejected onto the wafer W. Therefore, the gas stream has a diameter of about the size of the inside diameter of the outer nozzle 111.

Figure 10:
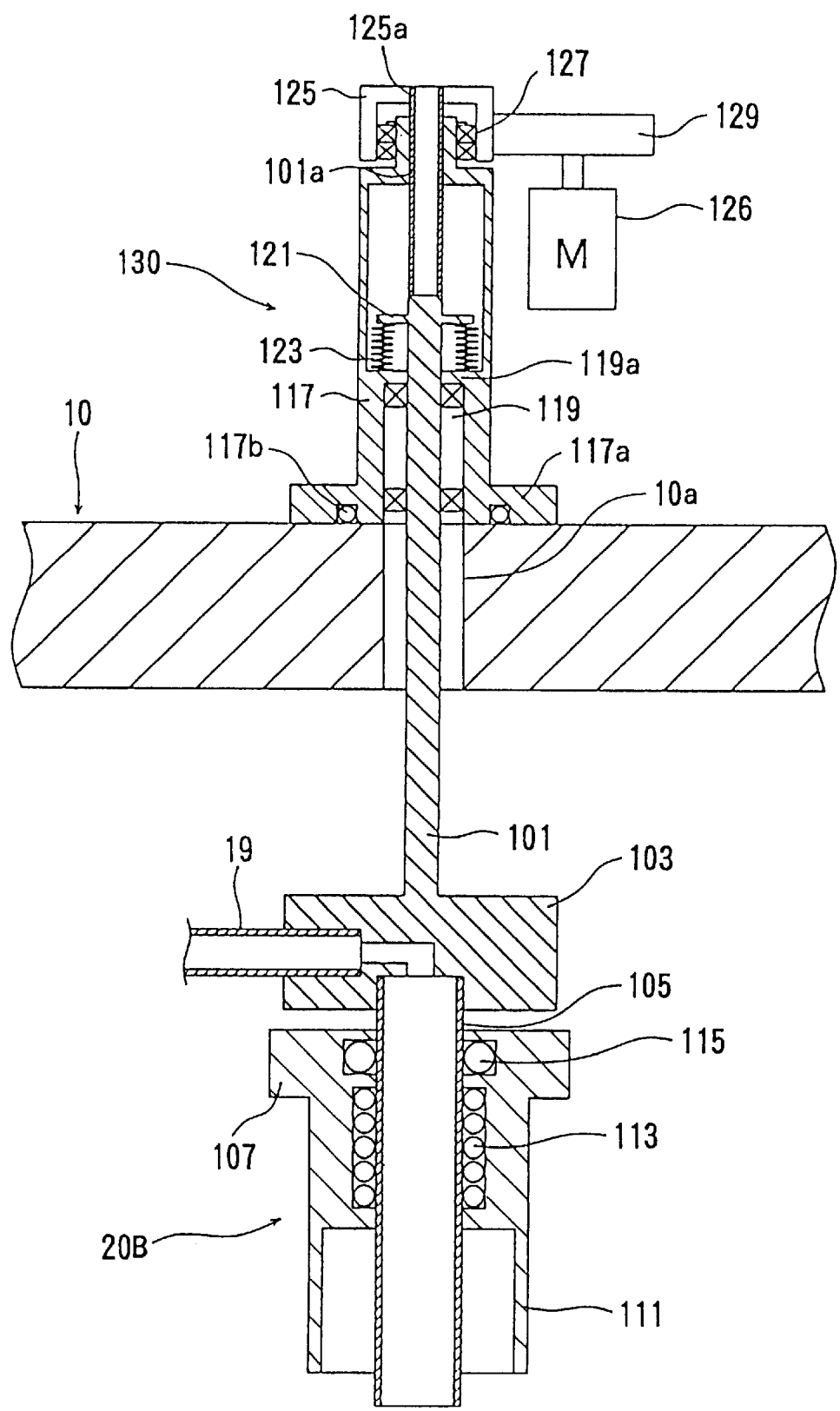
FIG. 10 is a cross sectional view showing the details of the nozzle device in the third embodiment.

Next, the motor 126 of the linear drive device 130 is operated to rotate the handle 125 through a given angle, the male-threaded section of the rod 101 moves linearly downward, which lowers the inner rod 105, and the downstream end of the nozzle 105 extends slightly beyond the downstream end of the outer nozzle 111, as shown in FIG. 10.

In this condition, the target location of the wafer W is brought directly under the inner nozzle 105 with a given vertical separation distance, and a polishing gas is supplied through the flexible tube 19. The gas is ejected at a supersonic (or sub-sonic) speed towards the wafer W, and because the inner nozzle 105 is extending beyond the outer nozzle 111, the gas stream is not affected by the outer nozzle 111 so that the size of the gas stream is about the same as the inside diameter of the inner nozzle 105. Therefore, this type of design will also provide a plurality of ejection diameters using only one nozzle device, thereby producing fine undulated structures having different sizes.

This embodiment illustrated a case of a dual structure nozzle device comprised by inner and outer tubes, but by adopting a triple nozzle device, it is possible to increase the choice of gas stream diameters. In effect, a plurality of nozzles of different diameters can be assembled into a nozzle unit so that the inner nozzles can be protruded out of the tip end of other outer nozzles by means of a multiple drive system.

In addition to the embodiments presented above, other variations can be considered as follows.

(1) The workpiece (wafer W in the above cases) may include other thin films such as Al and $SiO_2$ formed on Si wafers, glass substrates, semiconductor substrates and liquid crystal substrates. Polishing gas is chosen to suit the material of the workpiece, so that any type of polishing gas may be used so long as the basic requirement is fulfilled that the gas be a reactive gas with the material so that the surface can be etched and removed. These aspects of the process apply to the embodiments presented below.

(2) In the above embodiments, positioning operation was carried out by attaching the variable diameter nozzle device to the z-drive 17, and attaching the wafer W to the x-y table 11, but other positioning systems can be applied equally effectively. Other methods would include rotating the wafer while the nozzle device is moved in x-z directions. Other types of positioning can be used so long as the basic requirement of positioning the target location directly under the active portion of a nozzle device is achieved.

A fourth embodiment of the present invention of nozzle device will be presented in the following. FIG. 11 shows a cross sectional view of the details of an embodiment of the gas polishing apparatus. The overall construction of the gas polishing apparatus is the same as that shown in FIG. 1, and the polishing chamber 210 is disposed in the same position as the polishing chamber 10 in the first embodiment.

As shown in FIG. 11, the gas polishing chamber 210 includes at least an x-y table 211, a heater 213 provided above the table 211, and a variable diameter nozzle device 220 positioned at a given distance above the heater 213. The variable diameter nozzle device 220 is connected through a support rod 215 to a z-drive 217, and the nozzle device 220 is connected to three flexible tubes 219a, 219b and 219c for supplying the polishing gas.

FIGS. 12A~12C show the detailed structure of the nozzle device 220. FIG. 12C is a bottom view; FIG. 12A is a cross sectional view through a plane A—A in FIG. 12C; and FIG. 12B is a cross sectional view through a plane B—B in FIG. 12C. The nozzle device 220 is comprised by a cylindrical base section 221; three pipes 219a, 219b and 219c attached to the sidewall of the base section 221; three cylindrical nozzles 230a, 230b and 230c having different diameters attached to the bottom of the base section 221; and three gas passages 231 provided in the base section 221. Each of the three gas passages 231 independently connects pipe 219a to nozzle 230a; pipe 219b to nozzle 230b; and pipe 219c to nozzle 230c. The size of the nozzle opening of each nozzle 230a, 230b and 230c range between several micrometers to several tens of millimeters. The size is chosen to suit the size of the workpiece W. In FIGS. 12A~12C, only one connection between pipe 219b and nozzle 230b is shown but other connections are made in the same manner.

As shown in FIG. 11, pipes 219a, 219b and 219c extend out of the polishing chamber 210 and are connected to an external gas supply source 247 through respective valves V11, V12, V13, and mass flow controllers 243a, 243b and 243c. Polishing chamber 210 is connected to a nitrogen source 257 for supplying an inert gas $N_2$ through a valve V14 and a filter 255, and is also connected to a cleaning device 261 and a Roots pump 259 through a valve V15. As in the previous embodiment, the central controller 263 controls the operation of component devices such as mass flow controllers 243a, 243b, 243c, the x-y table 211 and the z-drive 217.

An example of the overall operation of the gas polishing apparatus will be explained in the following.

A wafer W (workpiece) is introduced into the wafer storage chamber 95 through the loading/unloading door 97 shown in FIG. 1. After processing the wafer W in the CMP chamber 90, the wafer W is scanned in the surface measuring chamber 80. Next, the wafer W is transferred from the surface measuring chamber 80 and is placed on top of the heater 13 (that is, on top of the x-y table 11) using the manipulator 72. Steps to this stage are the same as those in the first embodiment.

At this time, the gate valve 71 is closed and, while keeping the valves V11, V12, V13 and V14 closed, valve V15 is opened to evacuate the polishing chamber 210 to obtain a degree of vacuum (several torr to 0.01 torr) suitable for gas polishing.

Next, a target location of the wafer W memorized in the control device 263 is moved directly under a desired nozzle opening 230a (for example) of the nozzle device 220, by operating the x-y table 211. Also, the z-drive 17 is operated to adjust the vertical distance between the wafer W and the nozzle 230a to a pre-determined value. The wafer W is heated in the meantime to a desired temperature, 50° C. for example, by the heater 213.

Next, the polishing gas is supplied by opening the valve V11 so as to produce a mixture of a desired proportion of the component gases (a mixture of $ClF_3$ and Ar, for example) according to the predetermined polishing parameters including a flow rate and a flow duration. The gas is ejected from the downstream end of the nozzle 230a at an ultrasonic speed (or subsonic speed). This operation produces a fine undulated structure on the work surface of the wafer W, depending on the combination of flow rate, flow duration and the diameter of the nozzle 230a. The shape of the fine undulated structure is similar to the one shown in FIG. 4.

After completing to this stage, the above steps are repeated so that all of the target locations memorized in the control device 263 are processed. In this process, depending on the desired dimensions of the recess structures at the various locations, a desired operative diameter of the nozzle is selected from the nozzles 230a~230c, and the wafer is placed directly below the chosen nozzle, and an appropriate valve chosen from the corresponding valves V11~V13 is opened to carry out gas polishing.

When all the targeted locations have been processed, valves V11, V12, V13 are all closed, and the polishing gas is thoroughly exhausted from the polishing chamber 210, then the valve V15 is closed and the valve V14 is opened to return the polishing chamber 10 to an atmospheric pressure. The gate valve 71 is opened and the wafer W is taken out by the manipulator 72 to return the wafer W to the surface measuring chamber 80 to re-measure the surface structure. These steps are the same as the steps (10) and (11) presented earlier, and their explanation will be omitted.

As discussed earlier, the design of the variable diameter nozzle device 220 has a plurality of nozzle opening diameters given by the nozzles 230a~230c, and therefore, gas polishing operation can be carried out without having to change the nozzle device for different polishing requirements. It would be obvious that the number and the dimensions of the nozzles 230a~230c can be changed to suit various applications, so long as the basic requirement of having a plurality of nozzles having different diameters is fulfilled.

Figure 13:
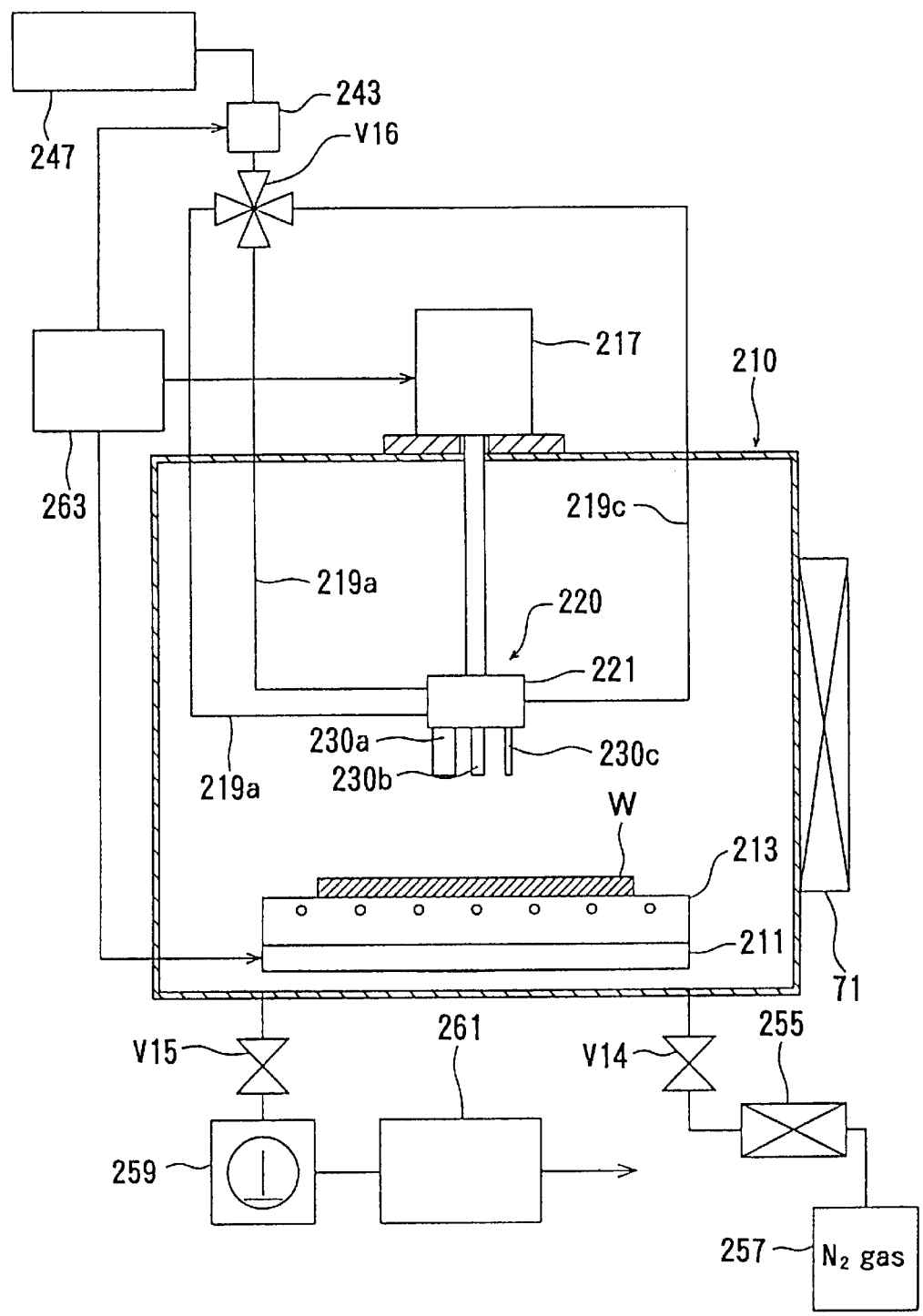
FIG. 13 is a cross sectional view of the gas polishing chamber based on a fifth embodiment of the nozzle device.

FIG. 13 shows a cross sectional view of a fifth embodiment of the nozzle device for the polishing chamber 210. The difference between the present arrangement and those shown earlier is that the three pipes 219a, 219b and 219c connected to the nozzle device 220 are connected to a four-way valve V16 which is connected to a gas source 247 through a mass flow controller 243. By switching the four-way valve V16, the gas stream can be directed to any one of the three pipes 219a, 219b and 219c. The operation of the system is the same as before.

Figure 14A:
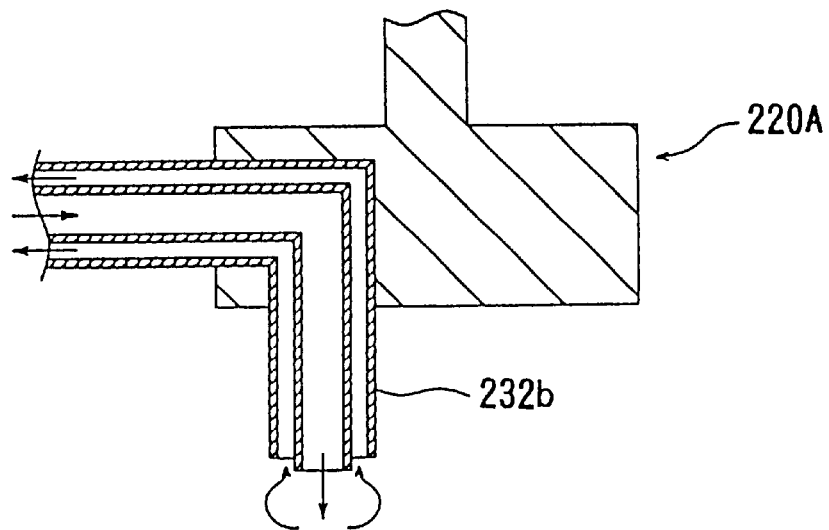
FIGS. 14A, 14B are, respectively, a cross sectional view through a plane C—C in FIG. 14B, and a bottom view of a sixth embodiment of the nozzle device.
Figure 14B:
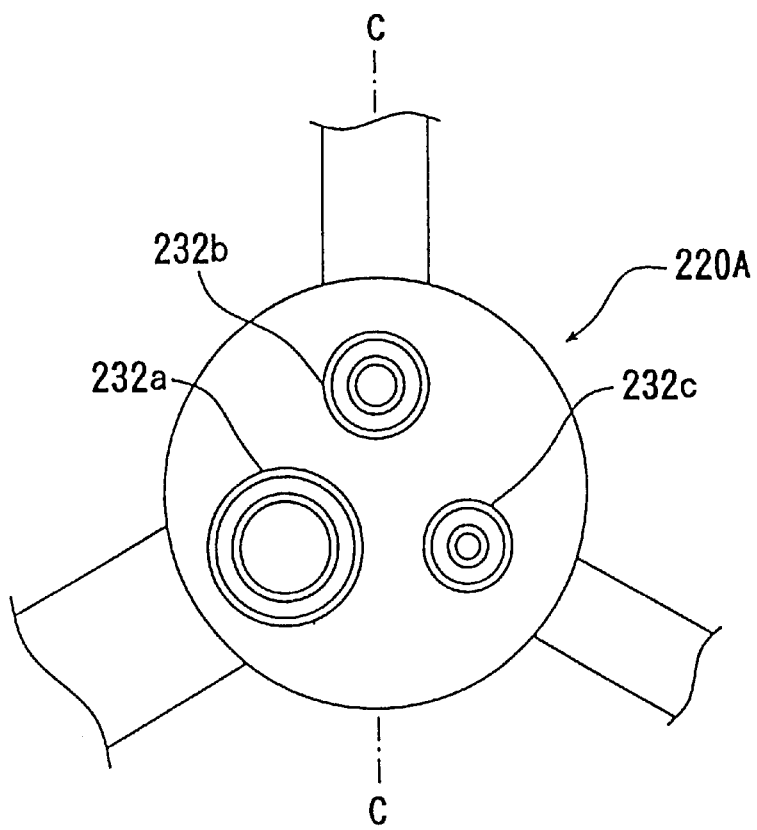
Figure 15:
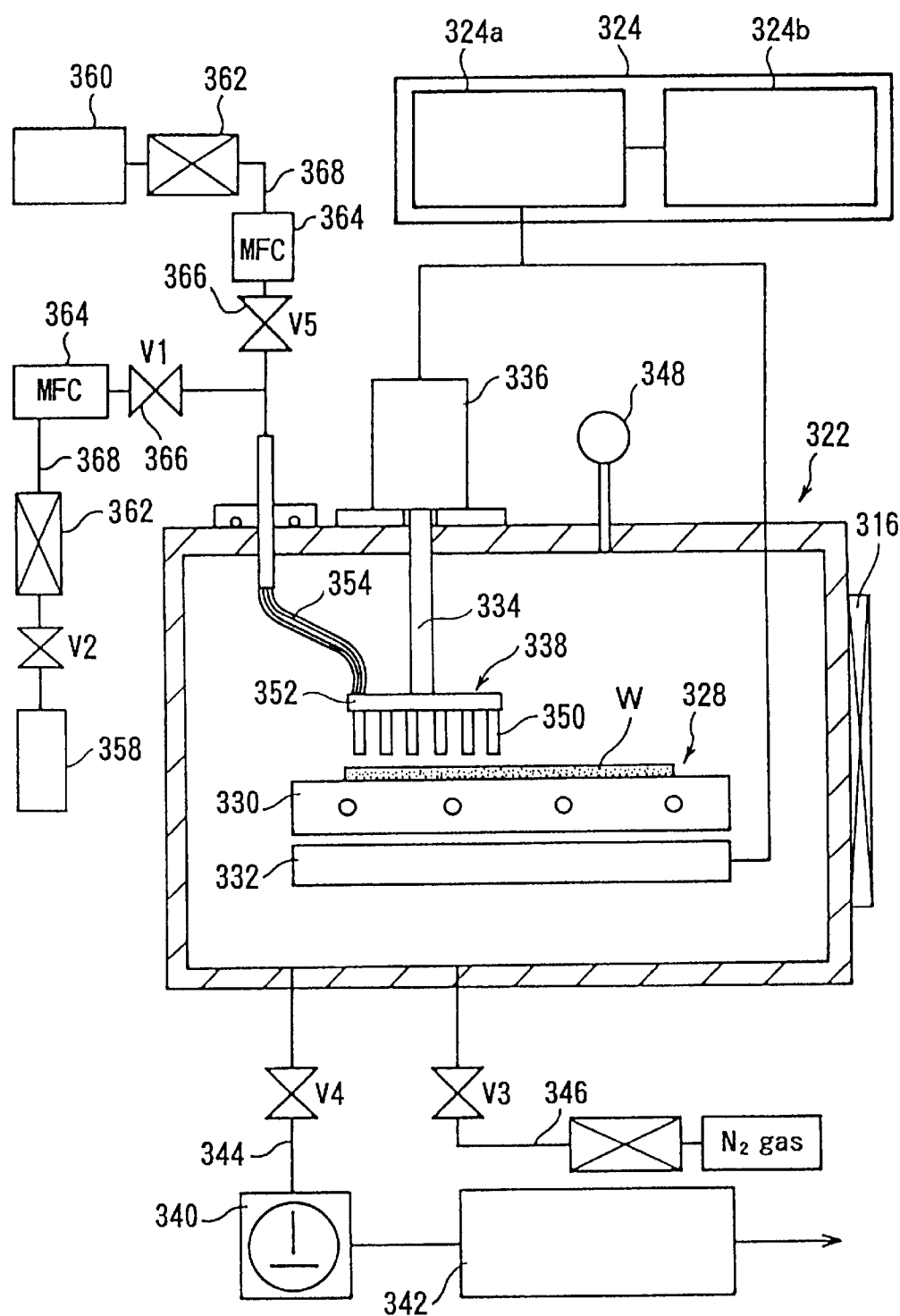
FIG. 15 is a cross sectional view of yet another gas polishing chamber.

FIGS. 14A, 14B show detailed structures of a sixth embodiment of the nozzle device 220A, where FIG. 14B shows a bottom view and FIG. 14A shows a cross sectional view through a plane C—C in FIG. 14B. The point of difference from the previous design is that each of the nozzles 232a, 232b and 232c is made of a coaxial tube structure comprised by an inner nozzle for ejecting the gas and an outer nozzle for exhausting the gas. The inner nozzles are connected to a gas source as in the first and second embodiment, and the outer nozzles are connected to an exhaust device (not shown).

In this case, any of the inner nozzles of the dual nozzles 232a, 232b and 232c of differing diameters can be positioned to face a target location for polishing. For example, if the inner tube of the nozzle 232b is used to eject the polishing gas, the outer tube is used to exhaust the gas.

This type of construction effectively prevents extraneous etching of areas other than the targeted area by dispersion of the polishing gas after it is has formed a fine undulated structure at the desired location on the work surface.

This nozzle device can be used in a different manner by rearranging the tasks for the nozzles so that, among the nozzles 230a~23c shown in FIGS. 12A~C, one of the nozzles, for example nozzle 230a, is used to carry out gas polishing while other nozzles 230b and 230c are used to exhaust the gas ejected from the nozzle 230a. This arrangement provides the same effect of preventing extraneous polishing as in the embodiment shown in FIGS. 14A, B.

The construction of the polishing chamber 322 comprises: a holding table 328 for placing the workpiece W disposed in the center of the polishing chamber 322, and includes an internal heater 330 to maintain the workpiece temperature, and a rotation device 332 to rotate the workpiece W in steps of a given angle. A nozzle assembly 338 supported on a support shaft 334 of an external elevator 336 is provided at a certain location above the holding table 328. Polishing chamber 322 is provided with a vacuum gage 348, a vacuum pump 340 to evacuate the polishing chamber 322 to a certain pressure, an exhaust passage 344 having a cleaning device 342 to remove harmful components from the exhaust gas, and a purge gas supply passage 346 to supply a purge gas as needed. A workpiece temperature sensor is also provided but it is not indicated in the drawing.

Figure 16:
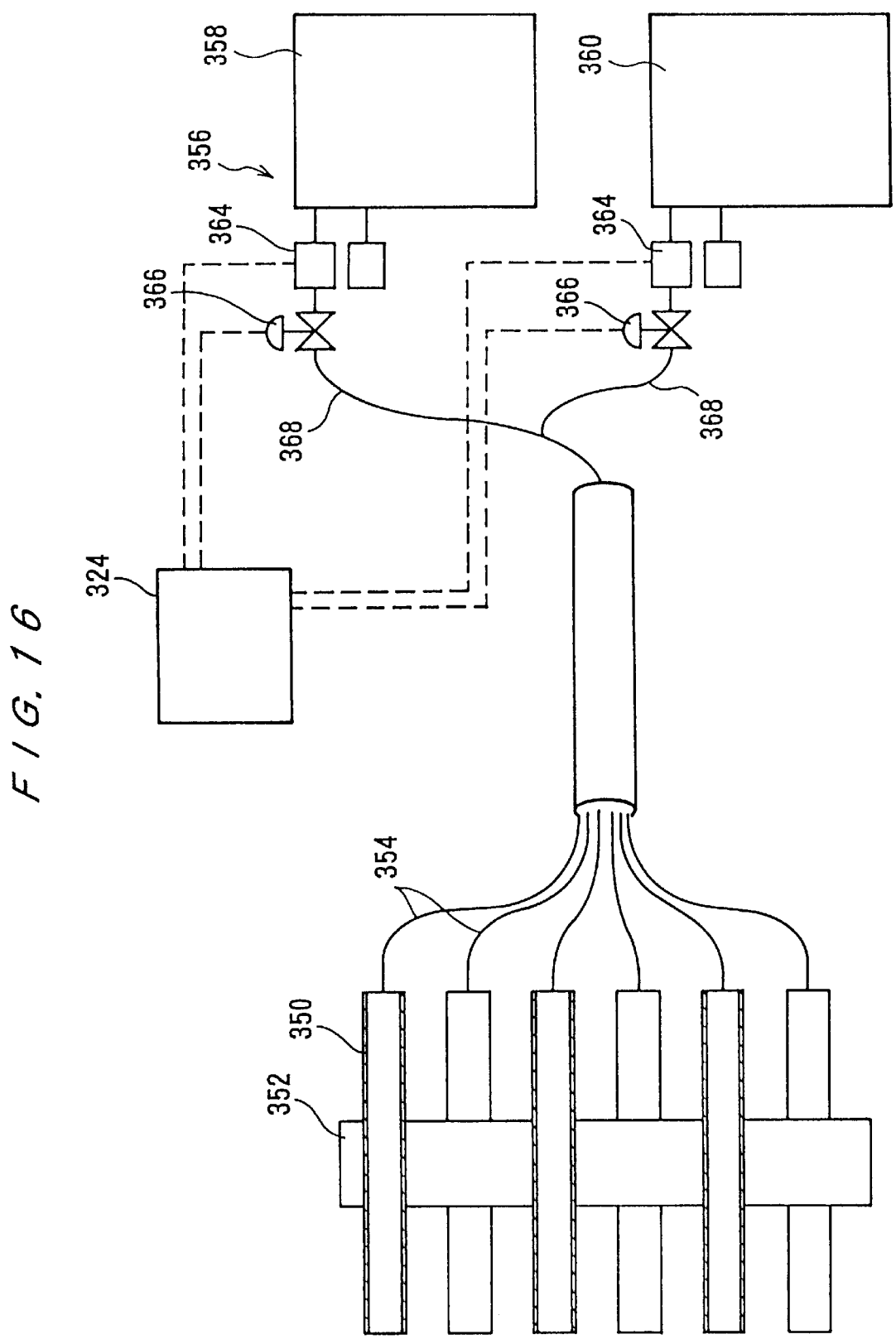
FIG. 16 is a schematic diagram of an ejection nozzle device.

The nozzle assembly 338 comprises a plurality of nozzles 350 opening at a lower surface of a nozzle disc 352, and each nozzle 350 is connected to a flexible gas supply tube 354 for supplying a reactive gas. The supply tubes 354 are bundled into a single path which is led out of the polishing chamber 322 and connected to an external polishing gas supply source 356, as shown in FIG. 16. In this example, the nozzle assembly 338 occupies ⅙ of the surface area of the workpiece W, and as shown in FIG. 17, the nozzle assembly 338 is comprised by a wedge shaped nozzle disc 352 having an apex angle of 60 degrees, and a plurality of nozzles 350 of a specific diameter distributed at equal distance D in a shape of an equilateral triangle.

The gas supply device 356, in this example, supplies a mixture of a reactive gas such as $ClF_3$ and an inert gas such as Ar, and each gas source 358, 360 supplies the respective gas through each supply pipe 368 having a filter, an MFC 364 and an electromagnetic valve 366. The MFC 364 and shutter valve 366 for each supply pipe 368 are connected to the output terminals of the process control device 324 to control flow rates and valve operation timing.

Control device 324 supplies polishing gas not in a continuous stream but in pulses by opening the shutter valve 366 periodically. By so doing, the polishing gas supplied to the target location reacts in an instant with the work surface of the workpiece W but is dispersed immediately to polish only the targeted location. Pulsed ejection facilitates control of the amount of polishing gas supplied to the location. But it is permissible to supply the polishing gas continually if it is desired.

Figure 18:
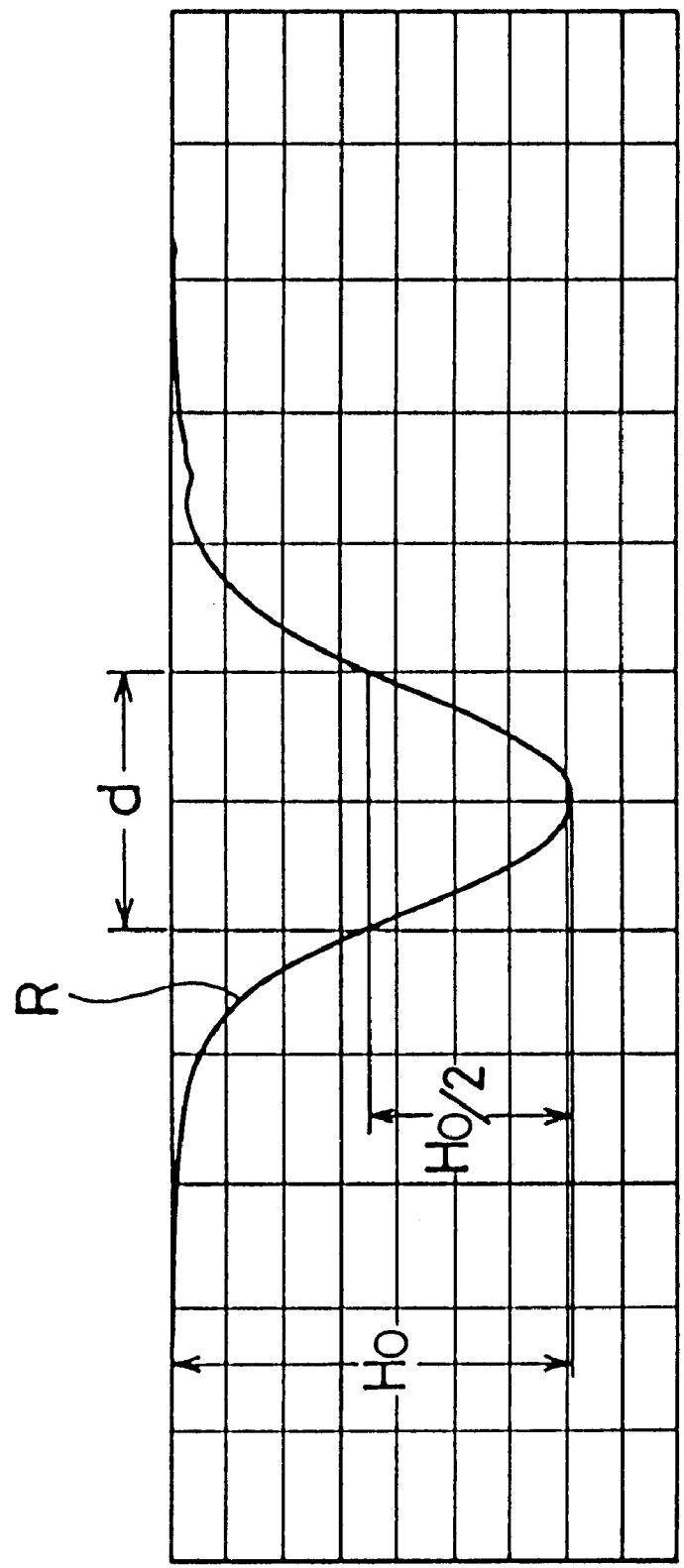
FIG. 18 is a graph showing the surface profile produced by a single nozzle.

The separation distance D of the nozzles 350 in the nozzle assembly 338 is determined in the following manner. When a single nozzle 350 is used, the etched recess is produced, as shown in FIG. 18, having a depth $H_0$ and a width value d at a half width position of the recess, such that $D=2s=d/1.117$, where s is a standard deviation. The value of the standard deviation varies depending on the polishing parameters. In this example, the following conditions were employed:

workpiece: polysilicon
polishing gas: $ClF_3$:Ar=1:2
nozzle diameter: 6.4 mm (inner diameter 4.8 mm)
gas flow rate: 90 cc
polishing time: 0.6 seconds
workpiece temperature: 50° C.
maximum etched depth $H_0$: about 1,000 Å.

The results obtained under such conditions of gas polishing will be presented with reference to FIG. 19, which shows the effects of nozzle spacing D on the shape of the surface profiles of the etched structure. The results indicate that the profile shape produced by a nozzle assembly 338 is a superposition of the individual etched profiles produced by single nozzles 350.

Figure 19A:
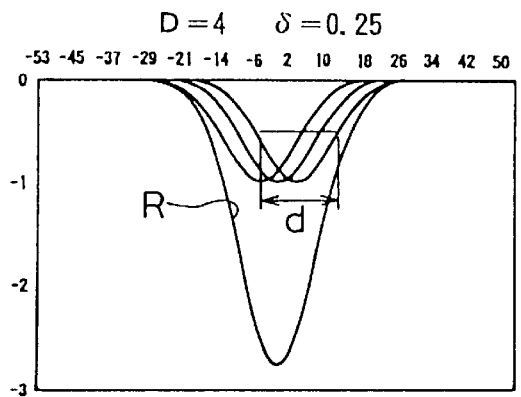
FIGS. 19A~19F are graphs of surface profiles to show the relationship between nozzle spacing and the shape of surface profiles produced.
Figure 19D:
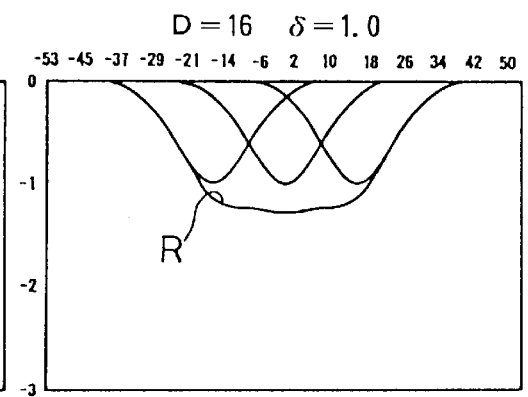
Figure 19B:
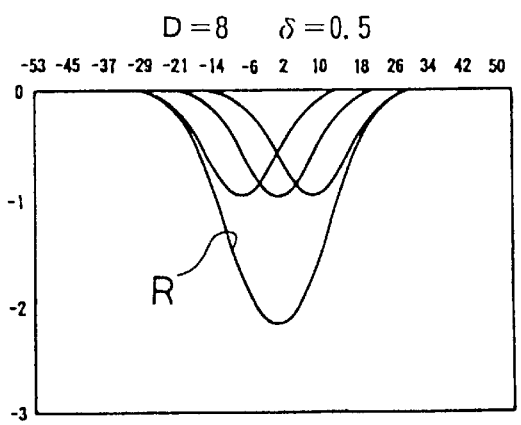
Figure 19E:
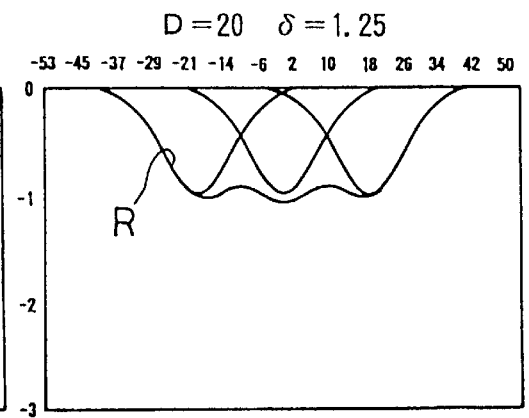
Figure 19C:
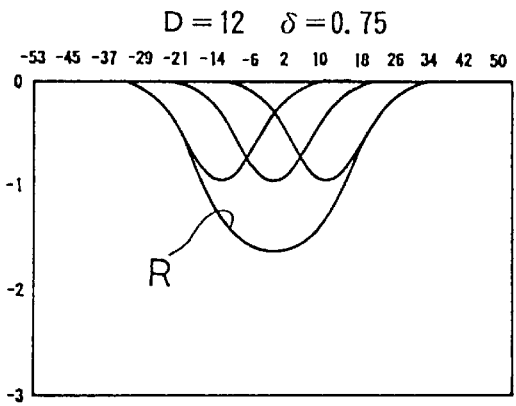
Figure 19F:
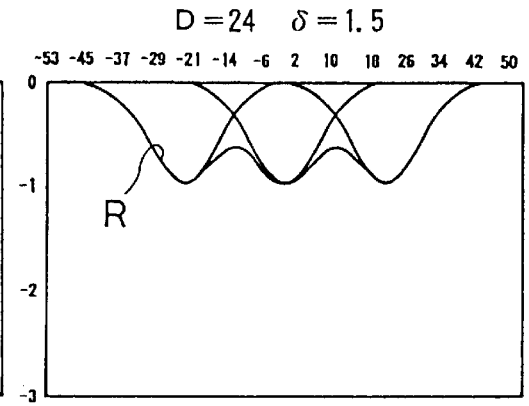

The results shown in FIGS. 19A~C indicate that, when D<2s as indicated by a ratio $d=D/2s=0.25~0.75$, a deep depression R is produced. When D=2s, a flat bottomed depression R is produced, as shown in FIG. 19D, while when D>2s, bottom profile of recess R becomes serrated as shown in FIGS. 19E or 19F. It follows, therefore, that to produce a flat area of an extended size, it is preferable that the ratio d be about 1. When d is less than 1, the shape of the etched recess is deeper and larger than that produced by a single nozzle, and therefore, when it is desired to remove a relatively large surface structure, D<d/1.177 should be used. As the size of the area to be polished increases, the nozzle spacing D' (for processing a larger area) should maintain a relation that D'=d'/1.177 (±10%) where d' is half of the width for a corresponding single nozzle. Under these conditions, an etched area of a large diameter having a flat bottom can be produced.

Next, the process of planarizing a work surface of a workpiece in a gas polishing apparatus will be explained. The workpiece W is transported from a storage chamber to a film measuring chamber, which performs measurements of film thickness over the entire work surface of the workpiece W using a film thickness measuring device, and the measured distribution data of film thicknesses are stored in an image processing section 324b in the process control section 324.

In this embodiment, because the nozzle assembly 338 has a shape corresponding to ⅙ the surface area of workpiece W, the polishing process is repeated six times, once for each ⅙ of sector of the total surface. Polishing parameters for six polishing process are separately determined for each of the nozzles 350.

Figure 20:
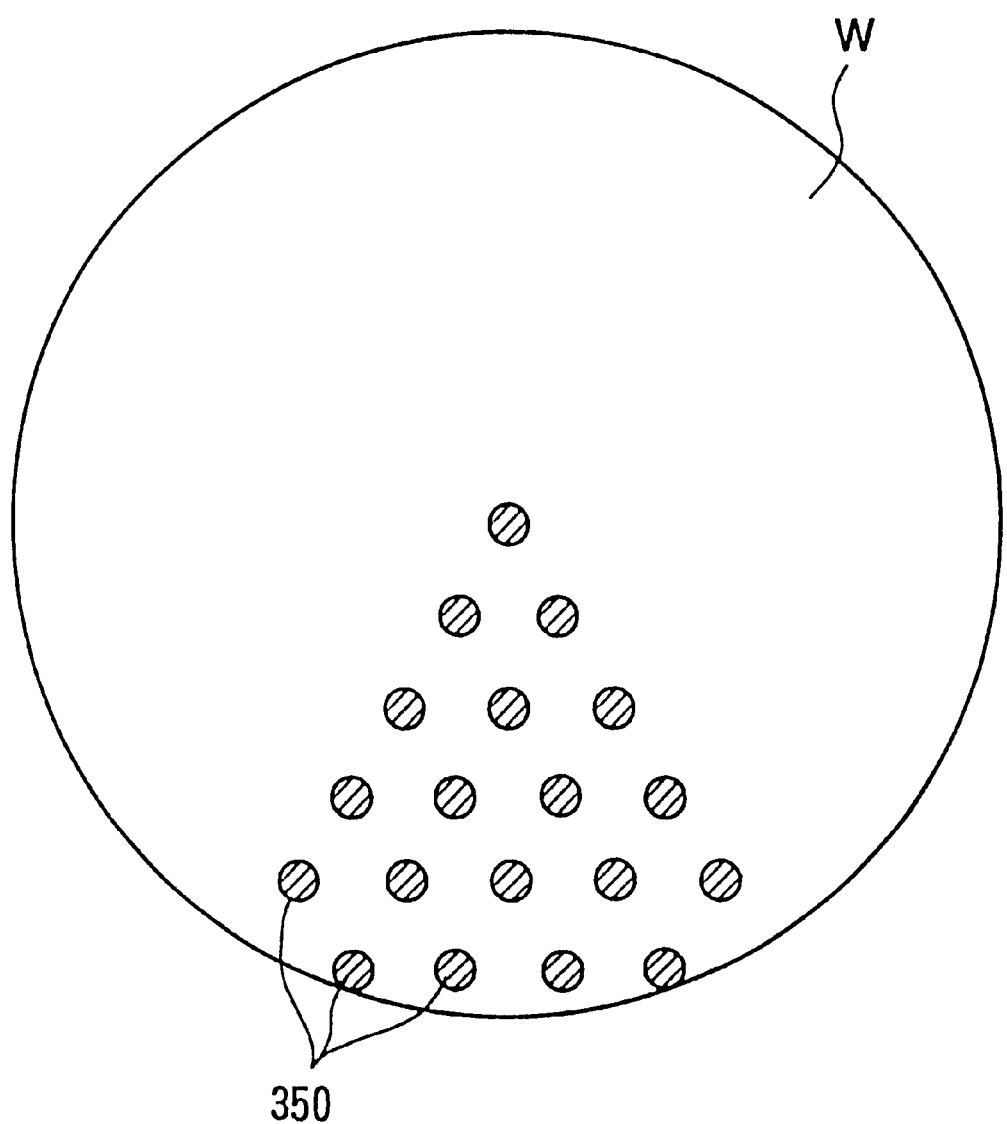
FIG. 20 is a plan view of the locations of nozzles for polishing a wafer.

Next, the workpiece W is transported by a robot into the polishing chamber 322, where it is polished according to the parameters described above. First, the polishing chamber 322 is evacuated to a desired vacuum, and the workpiece is warmed to a suitable temperature using the heater 330, and the first 1/6 sector on the work surface, as shown in FIG. 20, is polished by ejecting the polishing gas through the nozzles 350 according to the parameters specified. The height of the nozzle assembly 338 above the workpiece W is adjusted by the elevator 336 according to the details of the structure to be polished and the polishing parameters.

In this example, the ratio is chosen such that d=1.0 for three adjacent nozzles 350, and the results obtained is shown in FIG. 19D. A depression R has a profile shape of a flat-bottomed bowl. The shape and the area of the planar area produced are determined by selecting a suitable number for the nozzles 350 to be installed in the 1/6 sector. By producing such polished sectors having a depression R of a given profile successively over the entire sector of the workpiece W, a precisely flat surface can be produced in one sector. Next, the workpiece W is rotated another 1/6 turn to carry out polishing on the next sector, and by repeating this process for the remaining sectors, the entire work surface of the workpiece W can be processed.

After performing cleaning and drying of polished workpiece as necessary, the polished workpiece is returned by the robot to the film thickness measuring chamber to re-measure the film thickness. When the surface flatness is outside the allowable range, polishing is repeated, but when the flatness is within the allowable range, it is placed in a storage chamber. It is permissible to transfer the gas polished workpiece to a CMP process to remove microscopic surface irregularities.

The nozzle assembly 338 used in this embodiment has an advantage that, because the entire work surface is divided into six sectors, the size of the nozzle disc 352 can be made smaller than a nozzle disc covering the entire work surface. It is clear that the entire surface may be divided into two or more sectors. Also, in this example, the workpiece W was moved to bring the work surface under the nozzle assembly 338, but the nozzle assembly may be moved instead. Also, a fan shape was chosen for the shape of the nozzle disc 352, but the shape of the sector may be chosen suitably, and the direction of relative movement between the disc and the workpiece need not be limited to rotation, since linear movement in x-y directions may be more suitable in some cases. It is also permissible to use a nozzle disc of a large size to cover the entire workpiece, and such a disc would have an advantage that the polishing process can be carried out in one step.

FIG. 21 shows another embodiment of the nozzle assembly, in which each nozzle 350A is comprises a dual tube structure having an inner nozzle tube 370 and an outer exhaust tube 371. Each of the exhaust tubes 371 is merged at a manifold (not shown) which is connected to an exhaust passage having a vacuum pump. This exhaust passage may be a shared one with the polishing chamber 322, or an independent passage.

This design of nozzle assembly has an advantage that, because there is an exhaust tube 371 near the nozzle tube 370, polishing gas ejected from a nozzle is withdrawn within the vicinity of each nozzle and is discharged. Therefore, etching can be localized much more effectively to provide close control over the surface profile shape.

Figure 22:
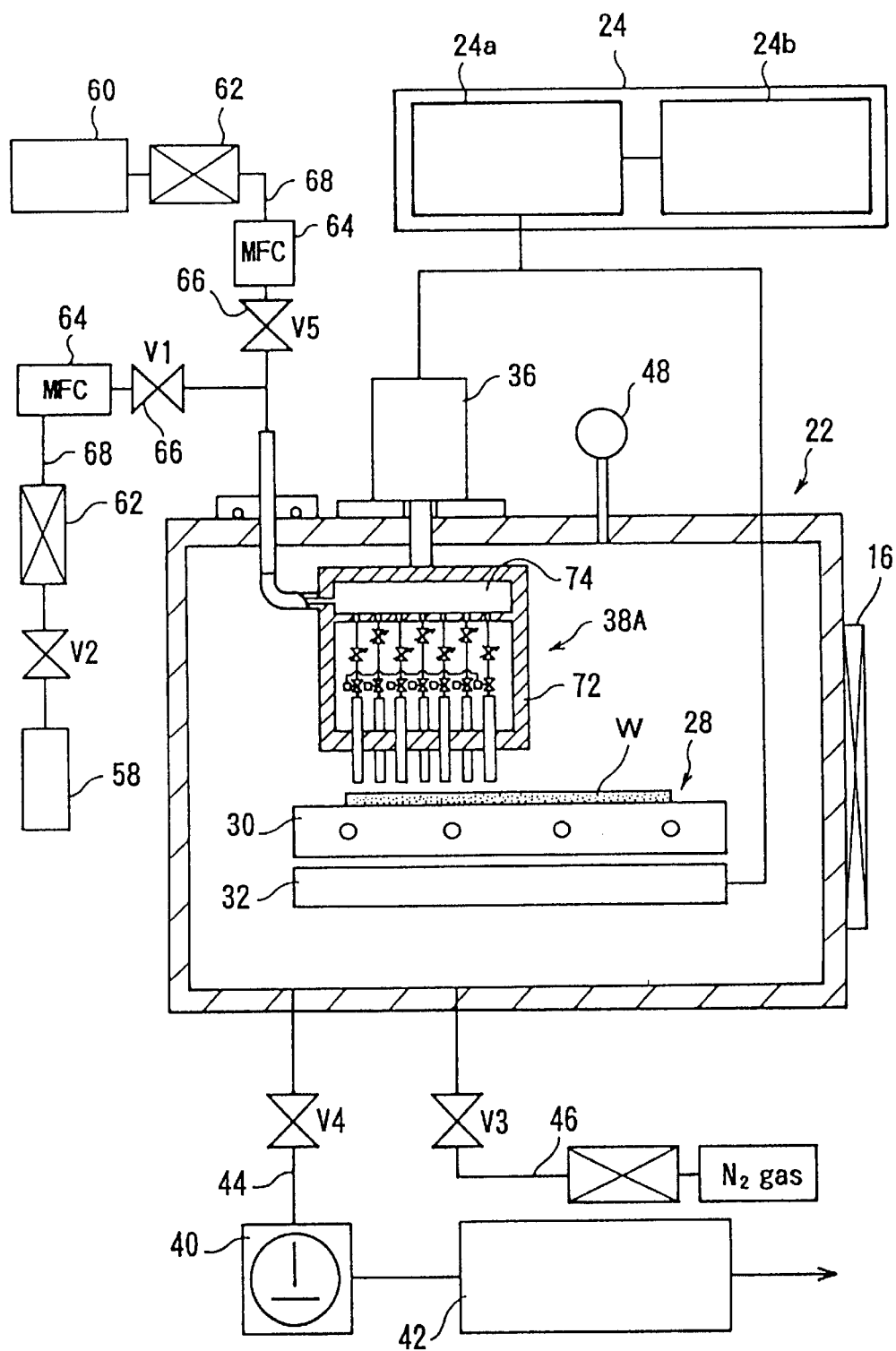
FIG. 22 is a cross sectional view of another example of the gas polishing chamber.
Figure 23:
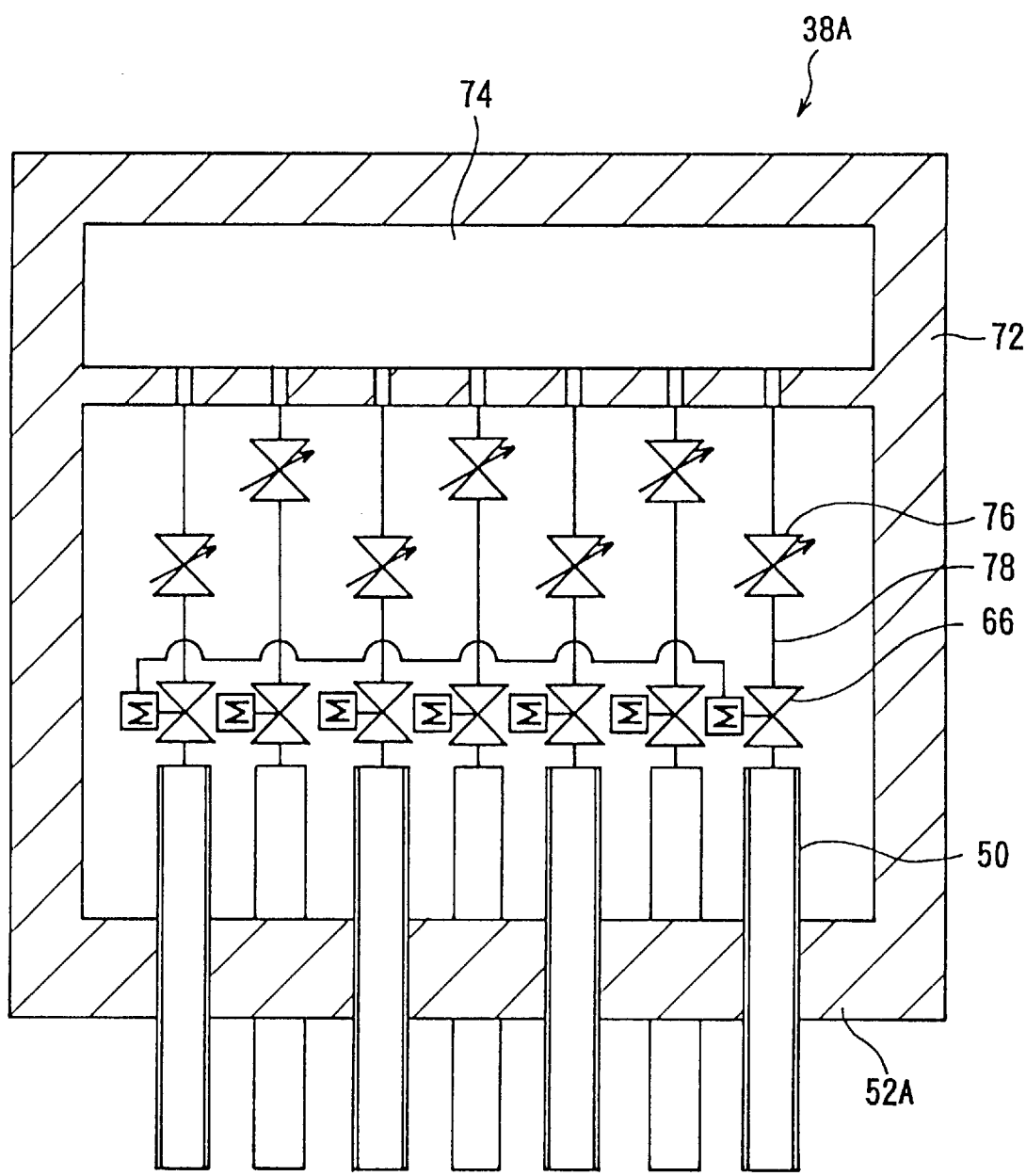
FIG. 23 is a cross sectional view of the nozzle assembly used in the chamber shown in FIG. 22.

FIGS. 22 and 23 relate to another embodiment of the gas polishing apparatus having a gas distribution section which is a component of a gas polishing apparatus incorporated into a nozzle assembly 38A. The nozzle assembly 38A comprises a casing 72 which is integral with a nozzle disc 52A; a header 74 disposed inside the casing 72 for storing the polishing gas at a given pressure; and supply pipes 78 connecting the header 74 and each nozzle 50 through a dedicated flow control valve 76 and a shutter valve 66. The valves 76, 66 are connected to the output terminals of a control device 24, and are controlled in the same manner as in the previous embodiment.

This gas polishing apparatus presents an advantage that, because the shutter valves 66 for closing/opening the nozzles 50 are located close to the tips of the nozzles 50, it is possible to prevent excess polishing caused by leaking of residual gas remaining in the space between the shutter valves 66 and the nozzle tips after the closure of the valves 66.

Figure 24A:
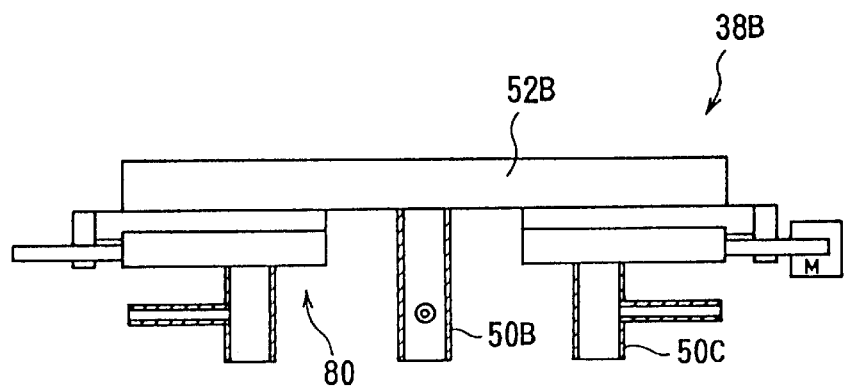
FIGS. 24A, 24B are, respectively, a cross sectional view and a plan view of another example of the nozzle assembly.
Figure 24B:
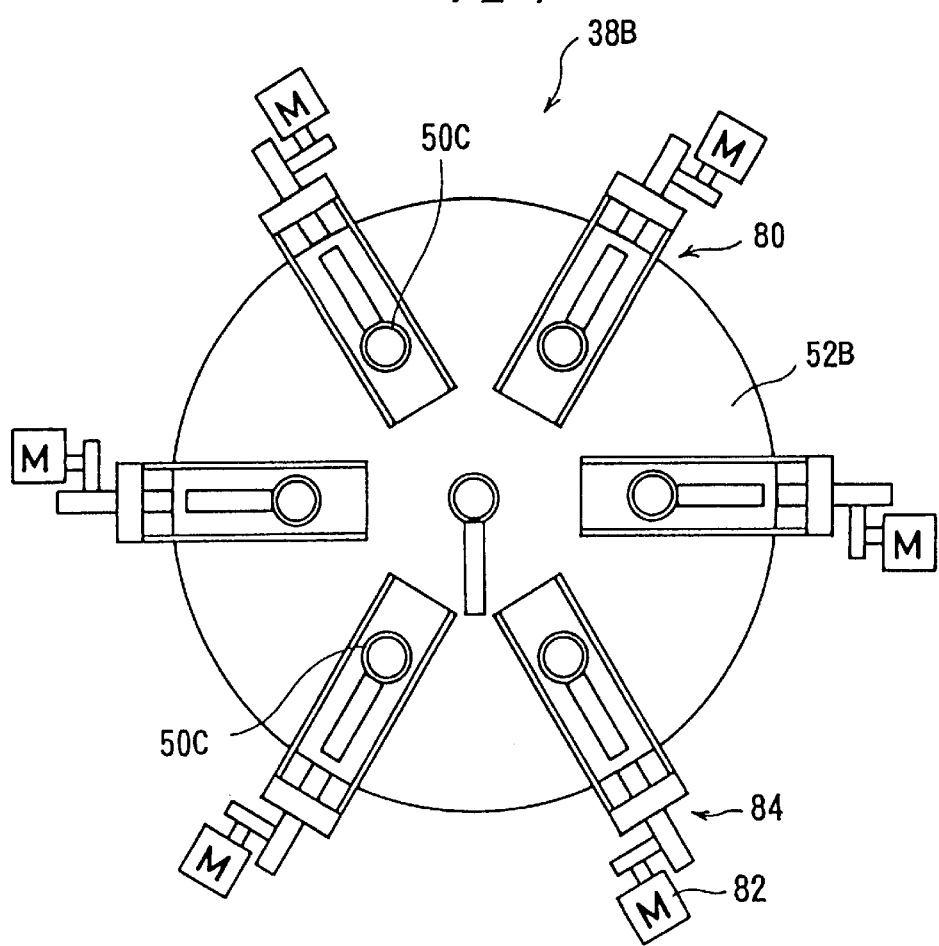
Figure 25:
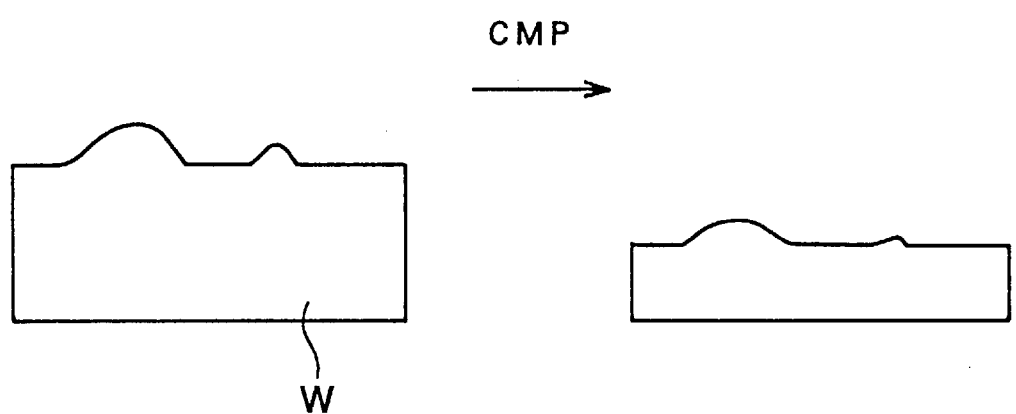
FIG. 25 is an illustration of the surface profiles produced by the conventional method of chemical/mechanical polishing.

FIGS. 24A and B show another embodiment of the nozzle assembly, and this nozzle assembly 38B comprises a nozzle disc 52B having a central fixed nozzle 50B surrounded by six movable nozzles 50C disposed equidistantly, which are movable in the radial direction on each sliding device 80. The sliding devices 80 each include a motor 82 and a worm gear 84 to convert a rotational motion to a linear motion. Although six movable nozzles 50C are provided in this example, further movable nozzles may be provided on the outer region. Also, in this example, each nozzle has an actuator (motor) 82, but they may be operated by one actuator (motor) through a linking mechanism.

In this design of the nozzle assembly 38B, the inter-nozzle distance D may be altered depending on the polishing condition. This design is useful when the value of 2s changes depending on the polishing conditions, the nozzle distance D may be adjusted to suit changes in the polishing condition so that a relation d=1 can be maintained. If it is desired to produce an etched structure of deep profile as illustrated in FIGS. 19A~19C, D can be decreased so that a relation d<1 is obtained.

What is claimed is:

1. A nozzle device, disposed to face a work surface of a workpiece, said nozzle device comprising:
   a nozzle assembly comprising a plurality of nozzles of differing diameters, each of said plurality of nozzles being operable to eject a reactive polishing gas to the work surface;
   a gas flow adjusting device operable to adjust a configuration or amount of gas flow ejected from said plurality of nozzles; and
   a nozzle selection device operable to select an operative nozzle having a desired diameter from said plurality of nozzles of said nozzle assembly for ejecting the reactive polishing gas.

2. A nozzle device according to claim 1, wherein said nozzle assembly further comprises:
   a nozzle plate provided with said plurality of nozzles; and
   a valving device disposed rotatably relative to said nozzle plate, said valving device being operable to selectively operate one nozzle for ejecting the reactive polishing gas.

3. A nozzle device according to claim 1, further comprising a plurality of exhaust pipes operable to exhaust gases, wherein each of said plurality of exhaust pipes is proximally disposed to a respective one of said plurality of nozzles.

4. A nozzle device according to claim 3, wherein each of said plurality of exhaust pipes and said respective one of said plurality of nozzles are arranged coaxially.

5. A nozzle device, disposed to face a work surface of a workpiece, said nozzle device comprising:
   a nozzle having an opening, said nozzle being operable to eject a reactive polishing gas to the work surface; and a gas flow adjusting device operable to adjust a configuration or amount of gas flow ejected from said nozzle, wherein said nozzle includes a nozzle diameter varying device operable to vary a diameter of the opening of said nozzle for ejecting the reactive polishing gas.

6. A nozzle device according to claim 5, wherein said nozzle diameter varying device comprises an iris device.

7. A nozzle device according to claim 5, wherein said nozzle diameter varying device comprises:

an inner nozzle located within said nozzle; and a drive device operable to produce an axial sliding movement of said inner nozzle with respect to said nozzle.

8. A nozzle device according to claim 5, further comprising an exhaust pipe proximally disposed to said nozzle.

9. A nozzle device according to claim 8, wherein said exhaust pipe and said nozzle are arranged coaxially.

10. A nozzle device according to claim 5, further comprising a flexible tube attached to an upstream end of said nozzle, said flexible tube being operable to supply the reactive polishing gas from a polishing gas source.

11. A gas polishing apparatus comprising:

a nozzle device having a nozzle, said nozzle device being operable to perform gas polishing by ejecting a reactive polishing gas to a work surface of a workpiece through said nozzle;

a control device operable to control polishing parameters according to surface structure data pre-measured from the work surface; and a nozzle diameter selecting device associated with said control device, said nozzle diameter selecting device being operable to select a specific diameter for said nozzle device according to the pre-measured surface structure data.

12. A gas polishing facility comprising:

a surface measuring chamber operable to determine surface structure data of a work surface of a workpiece;

a gas polishing chamber operable to perform gas polishing, said gas polishing chamber having a nozzle device operable to eject a reactive polishing gas to the work surface of the workpiece;

a chemical mechanical polishing chamber operable to perform at least one of chemical and mechanical polishing; and a control device operable to control polishing parameters, said control device having an associated nozzle diameter selecting device operable to select an operative diameter of said nozzle device in said gas polishing chamber according to the surface structure data determined in said surface measuring chamber.

13. A nozzle device for ejecting a reactive polishing gas towards a work surface of a workpiece, said nozzle device comprising:

a nozzle assembly including a plurality of nozzles arranged at a specific spacing; and a flow control device operable to adjust individual gas flow through each of said plurality of nozzles, wherein said flow control device has valves operable to individually control gas flow to said plurality of nozzles, said valves being integrally provided with said nozzle assembly.

14. A nozzle device according to claim 13, further comprising gas supply tubes operable to individually supply the reactive polishing gas to said plurality of nozzles, wherein said valves of said flow control device individually control a gas flow within said gas supply tubes.

15. A nozzle device according to claims 13, wherein said plurality of nozzles are separated by a distance D given by a relation:

$$0.9d/1.177 < D \leq 1.1d/1.177,$$

where d is half of a width of a recess profile produced by a single nozzle.

16. A nozzle device according to claim 13, wherein said nozzle assembly further comprises a nozzle position adjusting device operable to adjust a spacing between said plurality of nozzles.

17. A nozzle device according to claim 13, further comprising a plurality of exhaust pipes, wherein each of said plurality of exhaust pipes is proximally disposed to a respective one of said plurality of nozzles.

18. A polishing facility comprising:

a gas polishing apparatus comprising:
a nozzle device having a nozzle, said nozzle device being operable to perform gas polishing by ejecting a reactive polishing gas to a work surface of a workpiece through said nozzle, and
a flow control device operable to adjust gas flow through said nozzle; and a chemical mechanical polishing chamber having a polishing tool, said chemical mechanical polishing chamber being operable to perform at least one of chemical and mechanical polishing on the work surface of the workpiece with said polishing tool.

19. A polishing facility according to claim 18, further comprising a robot device having a manipulator, said robot device being operable to transfer the workpiece.

20. A polishing facility according to claim 18, further comprising a surface measuring device operable to determine fine surface structures on the workpiece.

21. A polishing facility according to claim 18, further comprising a workpiece storage chamber operable to store the workpiece therein.

* * * * *

UNITED STATES PATENT AND TRADEMARK OFFICE
CERTIFICATE OF CORRECTION

PATENT NO. : 6,315,858 B1
DATED : November 13, 2001
INVENTOR(S) : Shyuhei Shinozuka, Kaori Miyoshi, Akira Fukunaga and Yoichi Kobayashi It is certified that error appears in the above-identified patent and that said Letters Patent is hereby corrected as shown below:

Column 16,
Line 14, change "according to claims 13" to -- according to claim 13 --.

Signed and Sealed this

Twenty-eighth Day of May, 2002

Attest:

JAMES E. ROGAN
*Attesting Officer*     *Director of the United States Patent and Trademark Office*